United States Patent
Tanaka et al.

(10) Patent No.: US 8,390,020 B2
(45) Date of Patent: Mar. 5, 2013

(54) FACE-UP OPTICAL SEMICONDUCTOR DEVICE AND METHOD

(75) Inventors: Satoshi Tanaka, Tokyo (JP); Yusuke Yokobayashi, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 280 days.

(21) Appl. No.: 12/978,542

(22) Filed: Dec. 24, 2010

(65) Prior Publication Data

US 2011/0156087 A1 Jun. 30, 2011

(30) Foreign Application Priority Data

Dec. 24, 2009 (JP) .................................. 2009-292068
Jun. 29, 2010 (JP) .................................. 2010-147349

(51) Int. Cl.
*H01L 33/38* (2010.01)

(52) U.S. Cl. .................................. 257/99; 257/E33.065

(58) Field of Classification Search .................... 257/99, 257/773, E33.065
See application file for complete search history.

(56) References Cited

U.S. PATENT DOCUMENTS

| 7,989,819 B2* | 8/2011 | Fang et al. ........................ 257/79 |
| 2008/0185606 A1* | 8/2008 | Sano et al. ........................ 257/98 |
| 2009/0283789 A1* | 11/2009 | Kim et al. ........................ 257/99 |

FOREIGN PATENT DOCUMENTS

| JP | 2005-39264 A | 2/2005 |
| JP | 2008-4729 A | 1/2008 |

* cited by examiner

*Primary Examiner* — W. Wendy Kuo
(74) *Attorney, Agent, or Firm* — Kenealy Vaidya LLP

(57) ABSTRACT

A face-up optical semiconductor device can be prepared by forming an n-type GaN layer, an active layer, and a p-type GaN layer on a C-plane sapphire substrate. Parts of the p-type GaN layer and the active layer can be removed, and a transparent electrode can be formed over all or most of the remaining p-type GaN layer. A p-side electrode including a pad portion and auxiliary electrode portions can be formed on the transparent electrode layer. An n-side electrode can be formed on the exposed n-type GaN layer. On regions of the transparent electrode layer where weak light emission regions may be formed, outside independent electrodes can be provided. They can be disposed on concentric circles with the n-side electrode as a center or tangent lines thereof so as to be along the circles or the tangent lines. The outside independent electrodes can diffuse current from the p-side electrode to the n-side electrode flowing through the transparent electrode layer into the short side end portions of the transparent electrode layer, thereby decreasing the weak light emission regions.

22 Claims, 30 Drawing Sheets

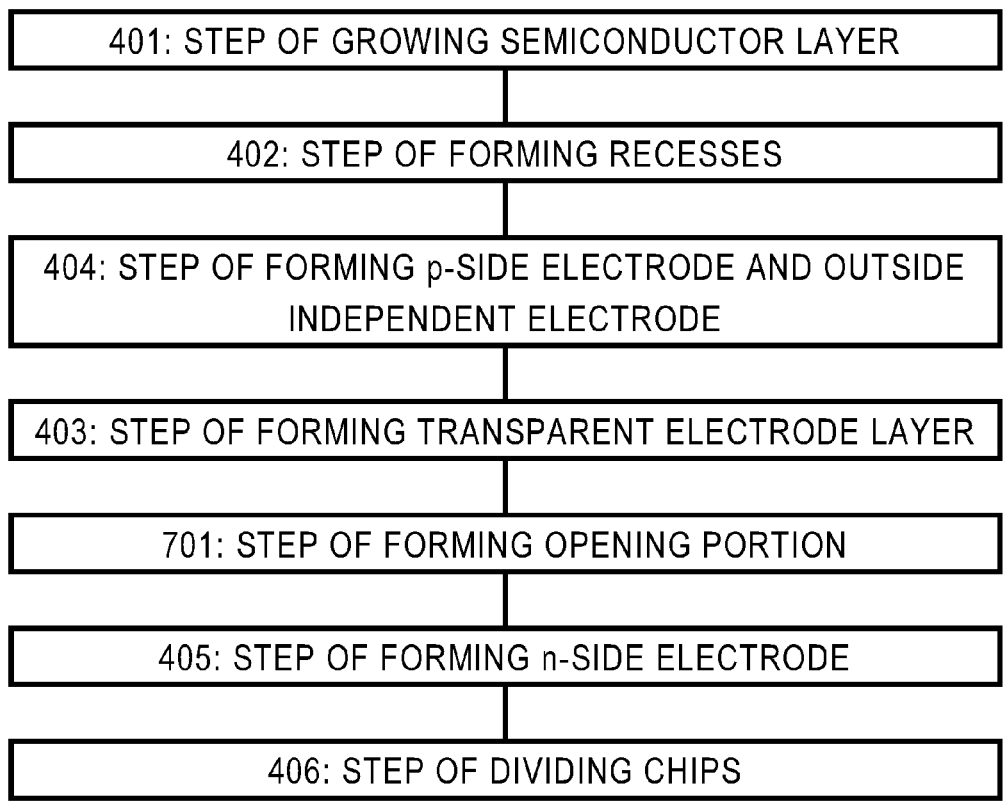

FACE-UP OPTICAL SEMICONDUCTOR DEVICE AND METHOD

This application claims the priority benefit under 35 U.S.C. §119 of Japanese Patent Applications No. 2009-292068 filed on Dec. 24, 2009 and No. 2010-147349 filed on Jun. 29, 2010, which are hereby incorporated in their entirety by reference.

TECHNICAL FIELD

The presently disclosed subject matter relates to an optical semiconductor device such as a light emitting diode (LED) and the like, and in particular, to a face-up optical semiconductor device.

BACKGROUND ART

Common face-up optical semiconductor devices can be configured to include various semiconductor layers (including an n-type semiconductor layer formed on an insulative growth substrate, and an active layer serving as a light emitting layer, and a p-type semiconductor layer), a transparent electrode layer, a p-side electrode formed on the transparent electrode, and an n-side electrode formed on an exposed portion of the n-type semiconductor layer. Here, the transparent electrode layer can be formed on an entire remaining p-type semiconductor layer after the p-type semiconductor electrode and the active layer are partly removed. In the thus-configured semiconductor device, the transparent electrode can have a function to even the light emission distribution by uniformly diffusing current flow across the entire optical semiconductor device. When the transparent electrode is simply designed without intended purpose, however, the current may concentrate near a straight line connecting the p-side electrode and the n-side electrode with the shortest distance at the center. This means the light emission distribution may be concentrated on and near this line, resulting in uneven light emission distribution.

FIG. 1 corresponding to FIG. 5 of Japanese Patent Application Laid-Open No. 2005-039264 is a top view showing a conventional face-up optical semiconductor device. The device of FIG. 1 has a square shape when viewed from above.

As shown in FIG. 1, an n-type semiconductor layer 102, an active layer 103 serving as a light emission layer, and a p-type semiconductor layer 104, are formed on a growth substrate 101. Also after removing part of the p-type semiconductor layer 104 and the active layer 103, a transparent electrode layer 105 is formed on the entire surface of the remaining p-type semiconductor layer 104 except for the outer peripheral portion of the optical semiconductor device. A p-side electrode 106 is formed on the transparent electrode layer 105 so as to be composed of an electrode seating portion 1061 (hereinafter, referred to as "pad portion") and secondary extending portions 1062a and 1062b (hereinafter, referred to as "auxiliary electrode portion"). An n-side electrode 107 is formed on an exposed portion of the n-type semiconductor layer 102. The distance between the p-side electrode 106 and the n-side electrode 107 is designed to be approximately constant, thereby causing a current flowing from the p-side electrode 106 to the n-side electrode 107 to be uniformly diffused as shown by the solid arrows in FIG. 1. In this case, if the distance between the p-side electrode 106 and the n-side electrode 107 is smaller than a current diffusion distance D which will be described later, the current flowing from the p-side electrode 106 to the n-side electrode 107 can reach the end of the transparent electrode layer 105 near the n-side electrode 107. Accordingly, the entire semiconductor layers disposed therebetween, in particular, the entire active layer 103, can be evenly supplied with a current, thereby evening the light emission distribution.

FIG. 2 is a top view of a second conventional face-up optical semiconductor device. The shape of the face-up optical semiconductor device of FIG. 2 is a rectangle. This is because such a recent type of optical semiconductor device can be often installed in a thin light source device for backlight purpose and the optical semiconductor device may be designed to have a rectangular top shape in order to conform to the shape of the thin light source device. It should be noted that a direction parallel to the short side of the rectangle is referred to as a short side direction whereas a direction parallel to the longer side of the rectangle is referred to as a longitudinal direction.

In FIG. 2, as in FIG. 1, an n-type semiconductor layer 102, an active layer 103, a p-type semiconductor layer 104, a transparent electrode layer 105, and an n-side electrode 107 are formed on a growth substrate 101. The p-side electrode 106' can be composed only of a pad portion. (See Japanese Patent Application Laid-Open No. 2008-4729, in particular, FIG. 1.) Namely, the auxiliary electrode portions 1062a and 1062b in FIG. 1 are not formed in this semiconductor device. In this configuration, if the p-side electrode 106' and the n-side electrode 107 can be configured to be made large with respect to the short side width, the current can be evenly diffused in the short side direction to a certain extent.

However, as shown in FIG. 2, the distance between the p-side electrode 106' and the n-side electrode 107 is not constant, but the current from the p-side electrode 106' may be concentrated at the short side center between the p-side electrode 106' and the n-side electrode 107 as shown by a thick arrow in FIG. 2. Part of the current flowing from the p-side electrode 106' to the n-side electrode 107 may flow via the short side center and sideward. This part of the current cannot sufficiently reach the end of the transparent electrode layer 105 near the n-side electrode 107 as shown by the thick arrow and thin allows in FIG. 2 if the distance between the p-side electrode 106' and the n-side electrode 107 is larger than a current diffusion distance D, which will be described later. In this case, a weak light emission region 108 may be generated where a light emission strength is remarkably low compared with the surrounding region near the p-side electrode 106', resulting in uneven light emission distribution. As shown in FIG. 2, in order to cause a current to flow to both outer sides in the short side direction, both the p-side electrode 106' and the n-side electrode 107 should be configured to occupy sufficient areas on both outer sides in the short side direction. However, in this case, the light extracting surface of the optical semiconductor device may be small. Namely, since the occupying ratio of the p-side electrode 106' with respect to the p-type semiconductor layer 104 is large, the p-side electrode 106' may shield the light emission from the active layer 103, thereby degrading the light extraction efficiency or light output.

FIG. 3 shows one countermeasure for solving the above problem. Specifically, the active layer 103, the p-type semiconductor layer 104, and the transparent electrode layer 105 are partly removed at the center area to configure the active layer 103', the p-type semiconductor layer 104', and the transparent electrode layer 105', thereby avoiding concentration of current at the center area (see FIG. 5 of Japanese Patent Application Laid-Open No. 2008-4729).

The optical semiconductor device in FIG. 3 is configured such that the p-type semiconductor layer and the active layer are partly removed to form the p-type semiconductor layer 104' and the active layer 103', thereby improving the unevenness of light emission distribution to some extent by causing the current to flow in the short side direction. However, the area of the active layer per one optical semiconductor device, or the light emission region, is decreased by the removed active layer, thereby lowering the light output. Furthermore, the distance between the p-side electrode 106' and the n-side electrode 107 is still not constant. Although the current flow from the p-side electrode 106' to the n-side electrode 107 can be improved when compared to the case of FIG. 2, the current flowing sideward in the short side direction may not reach the end of the transparent electrode layer 105' near the n-side electrode 107 as shown in FIG. 3 by thin arrows if the distance between the p-side electrode 106' and the n-side electrode 107 is greater than the current diffusion distance D which will be described later, thereby generating weak light emission regions 108a and 108b. Accordingly, the light emission distribution becomes uneven.

FIGS. 4A and 4B show another face-up optical semiconductor device as a comparative example where a rectangular face-up optical semiconductor device similar to one shown in FIG. 2 is provided with a p-side electrode composed of a pad portion and auxiliary electrode portions. FIG. 4A is a top view and FIG. 4B is a cross sectional view taken along B-B line in FIG. 4A.

In FIGS. 4A and 4B, respective semiconductor layers including an n-type GaN layer 2, an active layer 3, and a p-type GaN layer 4 are formed on a C-plane sapphire substrate 1. Then, part of the p-type GaN layer 4 and part of the active layer 3 are removed, and a transparent electrode layer 5 is formed over all or most of the entire surface of the remaining p-type GaN layer 4. Furthermore, a p-side electrode 6 including a pad portion 61 and auxiliary electrode portions 62a and 62b is formed on the transparent electrode layer 5. Then, an n-side electrode 7 is formed on the exposed portion of the n-type GaN layer 2.

In FIGS. 4A and 4B, the face-up optical semiconductor device has a rectangular plan shape having a longitudinal width of approximately 510 μm and a short side width of approximately 310 μm. The pad portion 61 of the p-side electrode 6 and the n-side electrode 7 can have a circular shape of approximately 60 μm in diameter so as to facilitate the wire bonding process. The auxiliary electrode portions 62a and 62b are formed on a circle with the n-side electrode 7 as a center. This means that the distance between the auxiliary electrode portions 62a and 62b of the p-side electrode 6 and the n-side electrode 7 can be made almost constant. In this semiconductor device configured as described above, the current flowing between the p-side electrode 6 and the n-side electrode 7 can be evenly diffused, and at the same time the p-side electrode 6 (or pad portion 61) can be decreased in area by the auxiliary electrode portions 62a and 62b. As a result, the ratio of the area of the p-side electrode 6 with respect to the light extracting surface can be decreased, thereby increasing the light output.

However, the conventional optical semiconductor device shown in FIGS. 4A and 4B has the following drawbacks, which will be described with reference to FIG. 5.

Supposing a case where the electrical resistivity is constant in the device, a current can flow through a shortest path between the p-side electrode 6 and the n-side electrode 7. In this case, since the distance between the auxiliary electrode portions 62a and 62b of the p-side electrode 6 and the n-side electrode 7 is made almost constant, the current can be evenly diffused between the p-side electrode 6 and the n-side electrode 7 as shown by solid lines and dotted arrows in FIG. 5. However, it is difficult to cause current to flow through regions 201a and 201b that are not interposed between the p-side electrode 6 and the n-side electrode 7, and accordingly, light emission from that region becomes weak (the regions may be referred to as "weak light emission regions"), whereby the light emission distribution becomes uneven.

To take a countermeasure, it can be considered to extend the auxiliary electrode portions 62a and 62b to the weak light emission regions 201a and 201b. However, in this case the longitudinal size of the optical semiconductor device should be expanded, meaning that the distance between the p-side electrode 6 and the n-side electrode 7 may not be constant. This may result in generation of current concentration region, which are not desirable.

Meanwhile, a current diffusion state within the transparent electrode layer 5 can be determined by a sheet resistance per unit length of the transparent electrode layer 5 and the contact resistivity between the transparent electrode layer 5 and the semiconductor layer (in this case, the p-type GaN layer 4). FIG. 5 shows the current flowing state where the solid arrows represent the main stream of current through any of the transparent electrode layer 5, the p-type GaN layer 4, and the active layer 3, and the dotted arrows represent the main stream of current through the n-type GaN layer 2 via the active layer 3. As shown in FIG. 5, almost all the current from the p-side electrode 6 cannot reach the end of the transparent electrode layer 5 near the n-side electrode 7 and can flow through the n-type GaN layer 2 at the region 202 below the active layer 3. The current scarcely flows through the transparent electrode 5 at the region 202, and accordingly, also scarcely flows through the underlying active layer 3, meaning that the underlying active layer 3 has a very low current density. As a result, the region 202 becomes a weak light emission region.

In the comparative example shown in FIGS. 4A and 4B, there are the large weak light emission regions 201a, 201b, and 202, thereby making the light emission distribution uneven, which is a problem.

It should be noted that an ideal current density of an optical semiconductor device with a completely even light emission distribution can show a constant value all over the transparent electrode layer. Namely, this means that the difference in light emission intensity between the most strong light emission region and the most weak light emission region in the optical semiconductor device, i.e., the difference in current density J (d) is small. However, the face-up optical semiconductor device shown in FIGS. 4A and 4B has the p-side electrode and the n-side electrode 7 that are disposed away from the semiconductor layers (2, 3, and 4) in the vertical direction (stacked direction) and the horizontal direction (plane direction of the device). This may result in uneven diffusion of current sufficiently to the end portion of the optical semiconductor device, i.e., the n-side electrode 7. As a result, the weak light emission regions 201a, 201b, and 202 cause an uneven light distribution.

The following three methods may be considered for decreasing the light emission intensity difference in the optical semiconductor device to decrease the weak light emission region 202, namely, to increase the current diffusion distance D.

One of the methods is such that the thickness of the transparent electrode layer 5 can be increased to decrease the sheet resistance $\rho_{ITO}$. When the sheet resistance can be decreased, the current density J (d) can be lowered at d=0 whereas the current density J (d) at the n-side electrode 7 can be increased, thereby obtaining an ideal current density J (d). However, this method may have adverse effects such that, when the light passes through the transparent electrode layer 5, the amount of absorbed light may increase to lower the light extraction efficiency. Furthermore, decreasing the sheet resistance lower than 5 Ω/sq. is quite difficult in terms of manufacturing. In addition to this, the deposition process may require a longer time, thereby decreasing the yield in view of maintaining a uniform film thickness in the wafer and also increasing the manufacturing cost.

The second method is to increase the contact resistivity r2 between the transparent electrode layer 5 and the semiconductor layer (in this case, it can be p-type GaN layer 4). However, this method may increase the forward voltage in the optical semiconductor device.

The third method is to saturate the current flowing into the active layer 3 by increasing the supplied current $I_S$, thereby increasing the current diffusion distance D. In this method, however, the bonding wire connected to the pad portion 61 and the thin auxiliary electrode portions 62a and 62b may be supplied with a large amount of current. This may result in reliability deterioration, such as disconnection of bonding wires, peeling off of the auxiliary electrode portions 62a and 62b, and the like, and decreased inner quantum efficiency may arise due to the increased current density.

SUMMARY

The presently disclosed subject matter was devised in view of these and other problems and features and in association with the conventional art. According to an aspect of the presently disclosed subject matter, a face-up optical semiconductor device can include: a first semiconductor layer of a first conductive type; an active layer provided on the first semiconductor layer; a second semiconductor layer of a second conductive type provided on the active layer; a transparent electrode layer provided on the second semiconductor layer; a first electrode having a pad portion provided on any of the second semiconductor layer and the transparent electrode layer and an auxiliary electrode portion connected to the pad portion; a second electrode provided on an exposed region of the first semiconductor layer; and at least one outside independent electrode disposed adjacent to the transparent electrode layer and between the auxiliary electrode portion and the second electrode, the outside independent electrode being physically independent of the auxiliary electrode portion. The auxiliary electrode portion can be disposed on a first circle having a center located at the second electrode or on a tangent line of the first circle. The outside independent electrode can be disposed on a second circle having a center located at the second electrode or on a tangent line of the second circle so as to be an arc or linear electrode along the circle or the tangent line. A first radial distance between the first circle of the auxiliary electrode portion and the second circle of the outer independent electrode both having the center at the second electrode is smaller than a minimum value distance between the pad electrode of the first electrode and an area where a current density of a transparent electrode layer in a case where the optical semiconductor device does not have the outer independent electrode is minimum. This configuration can decrease the weak light emission region at the side regions of the optical semiconductor device.

If the first radial distance is close to the minimum value distance, since the outer independent electrode receives a small amount of current, the improvement of the light emission distribution may be small. Accordingly, the first radial distance can be equal to or less than a current diffusion distance, the current diffusion distance being derived such that a difference between a minimum current density and a current density at the current diffusion distance becomes substantially 0.01 when a current density difference between a current density immediately below the pad portion and the minimum current density in the optical semiconductor device without the outside independent electrode is considered as substantially 1. For example, the sheet resistance of the transparent electrode layer can be substantially 10 Ω/sq. to 25 Ω/sq., the contact resistivity between the second semiconductor layer and the transparent electrode layer can be substantially $5\times10^{-4}$ Ωcm² to $7\times10^{-4}$ Ωcm², and the current diffusion distance can be approximately 170 μm. In another example, in order to increase the current the outside independent electrode is supplied with, the first radial distance can be substantially 15 to 90% of the current diffusion distance.

The face-up optical semiconductor device according to the presently disclosed subject matter can further include at least one center independent electrode disposed between the auxiliary electrode portion and the second electrode. The center independent electrode can be disposed on a third circle having a center located at or adjacent the second electrode or a tangent line of the third circle so as to be along the third circle or the tangent line. This configuration can decrease the weak light emission region at the center of the optical semiconductor device.

The face-up optical semiconductor device according to the presently disclosed subject matter can further include at least one transparent insulation layer disposed between the auxiliary electrode portion and the outside independent electrode adjacent to the auxiliary electrode portion or adjacent two outside independent electrodes. The transparent insulation layer can be disposed on a fourth circle having a center located at or adjacent the second electrode or a tangent line of the fourth circle so as to be along the fourth circle or the tangent line. Furthermore, the transparent insulation layer can be formed to include an intersection between the fourth circle and a line connecting the center of the second electrode and an outside end portion of the auxiliary electrode portion or an outside end portion of the outside independent electrode near the first electrode out of the two outside independent electrodes. Furthermore, the total of the distance from the intersection to the outside end portion of the transparent insulation layer and a fourth radial distance between the first circle and the second circle on which the outside independent electrode adjacent to the auxiliary electrode portion is formed with the second electrode as a center, or a fifth radial distance between the two second circles on which the two adjacent outside independent electrodes are formed with the second electrode as a center, can be smaller than the minimum value distance. In this configuration, the transparent insulation layer can diffuse the current toward the outer sides of the device, thereby decreasing the weak light emission region at the side regions of the optical semiconductor device.

Furthermore, a transparent insulation layer similar to the previous insulation layer may be provided between the outside independent electrode and the center independent electrode. This transparent insulation layer can diffuse the current toward the center of the device, thereby decreasing the weak light emission region at the center portion of the optical semiconductor device.

In the above configuration, the outside independent electrode, the center independent electrode, and the transparent insulation layer can decrease the weak light emission region, thereby evening the light emission distribution. Namely, the outside independent electrode and/or the center independent electrode that is physically separated from the auxiliary electrode portion can be disposed between the first electrode and the second electrode. This configuration can substantially reduce the sheet electrode of the transparent electrode layer in a direction from the first electrode to the second electrode, whereby the current diffusion in this direction can be facilitated and the current density distribution, or the light emission distribution, can be evened. Furthermore, the outside independent electrode or the center independent electrode may be disposed on the same potential of electric field formed by the first electrode and the second electrode, thereby facilitating the current diffusion in the same potential direction and even the current density distribution, or the light emission distribution. In the above configuration, the transparent insulation layer can be formed near the end portions of the auxiliary electrodes, the outside independent electrodes, and the center independent electrode in order to adjust the diffusion direction of current, thereby evening the current diffusion over the entire optical semiconductor device. Accordingly, this configuration can even the light emission distribution.

BRIEF DESCRIPTION OF DRAWINGS

These and other characteristics, features, and advantages of the presently disclosed subject matter will become clear from the following description with reference to the accompanying drawings, wherein:

FIG. 12 is a flow chart describing a method for manufacturing the face-up optical semiconductor device of FIGS. 10A to 11C;

DESCRIPTION OF EXEMPLARY EMBODIMENTS

A description will now be made below to face-up optical semiconductor devices of the presently disclosed subject matter with reference to the accompanying drawings in accordance with exemplary embodiments.

Figure 6:
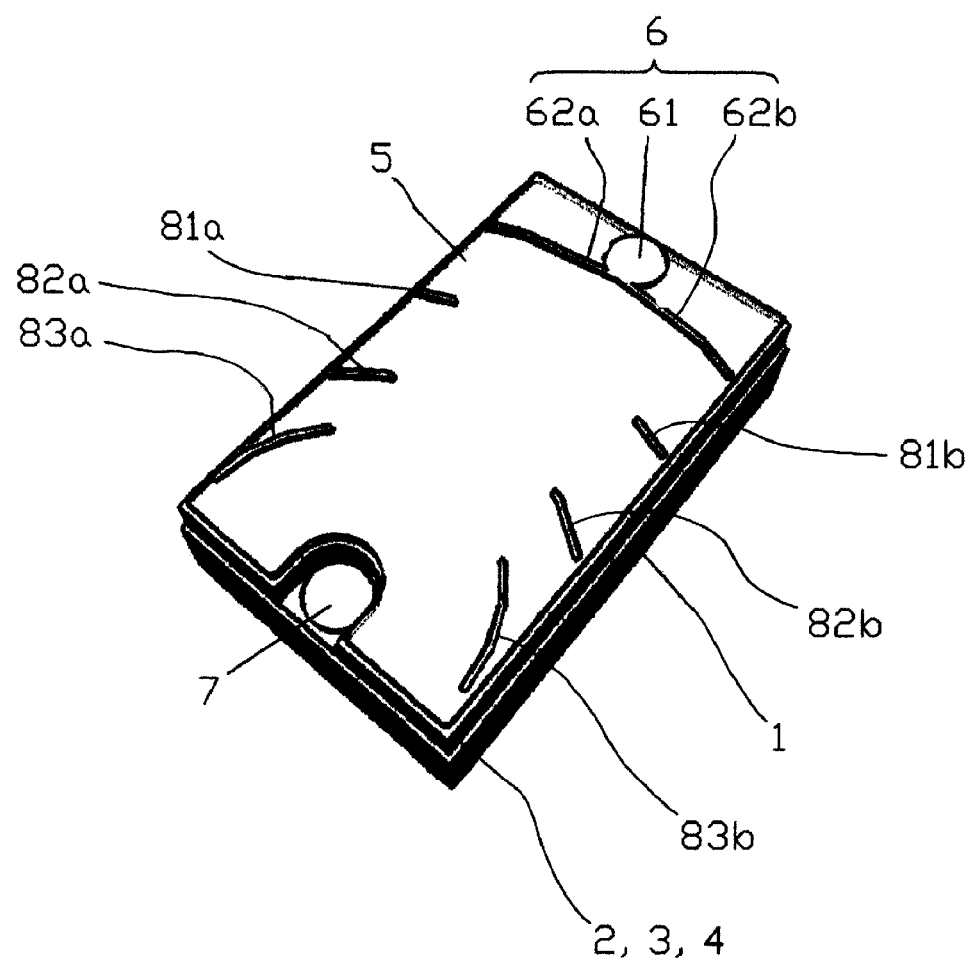
FIG. 6 is a perspective view showing a first exemplary embodiment of a face-up optical semiconductor device made in accordance with principles of the presently disclosed subject matter.
Figure 7A:
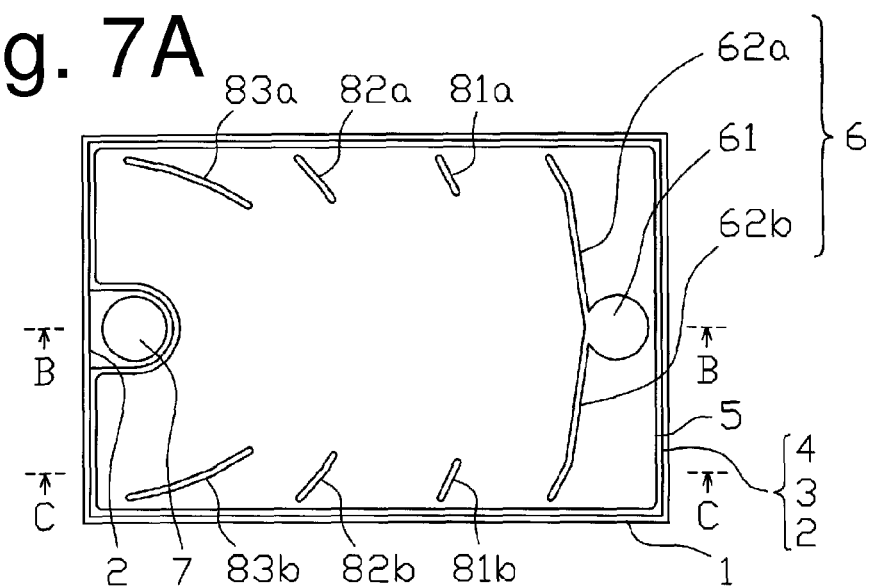
FIGS. 7A, 7B, and 7C are a top view, a cross sectional view taken along the line B-B in FIG. 7A, and a cross sectional view taken along the line C-C in FIG. 7A, respectively, showing the details of the face-up optical semiconductor device of FIG. 6.
Figure 7B:
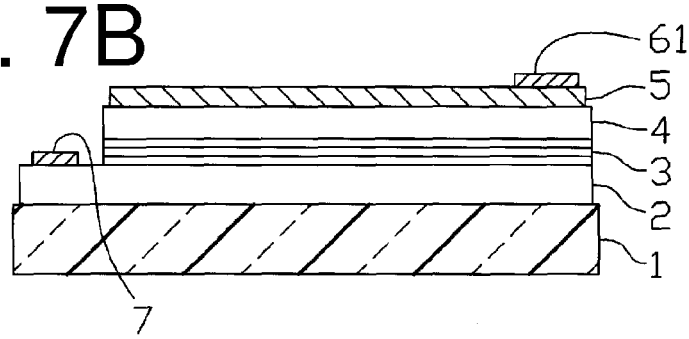
Figure 7C:
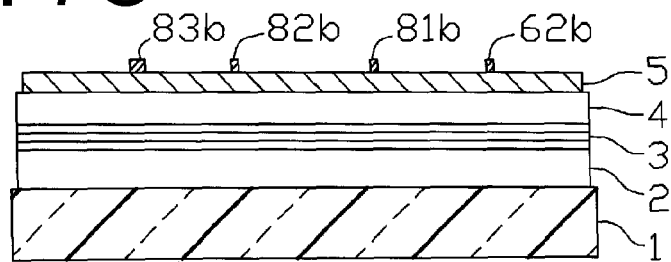

FIG. 6 is a perspective view showing a first exemplary embodiment of a face-up optical semiconductor device made in accordance with principles of the presently disclosed subject matter. FIGS. 7A, 7B, and 7C are a top view, a cross sectional view taken along the line B-B in FIG. 7A, and a cross sectional view taken along the line C-C in FIG. 7A, respectively, showing the details of the face-up optical semiconductor device of FIG. 6.

Figure 1:
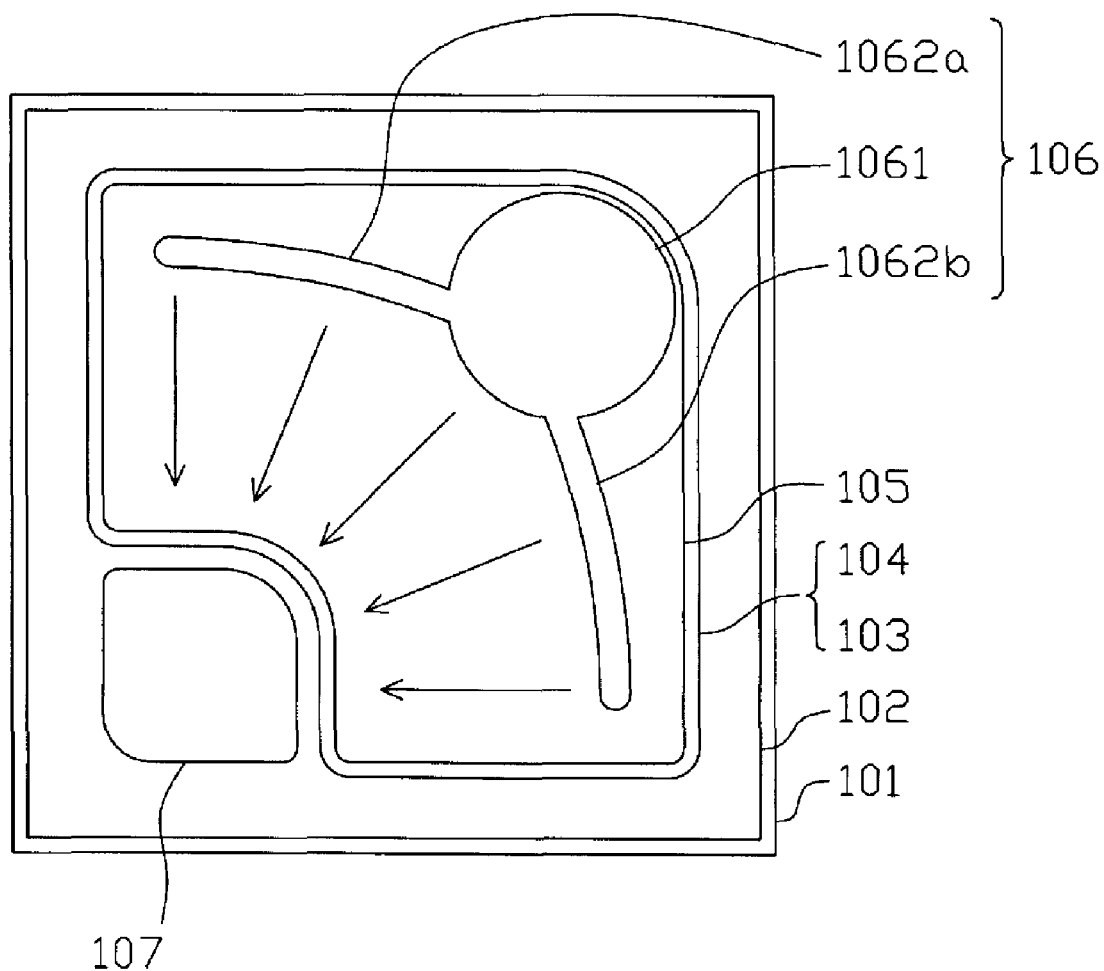
FIG. 1 is a top view showing a first conventional face-up optical semiconductor device.
Figure 2:
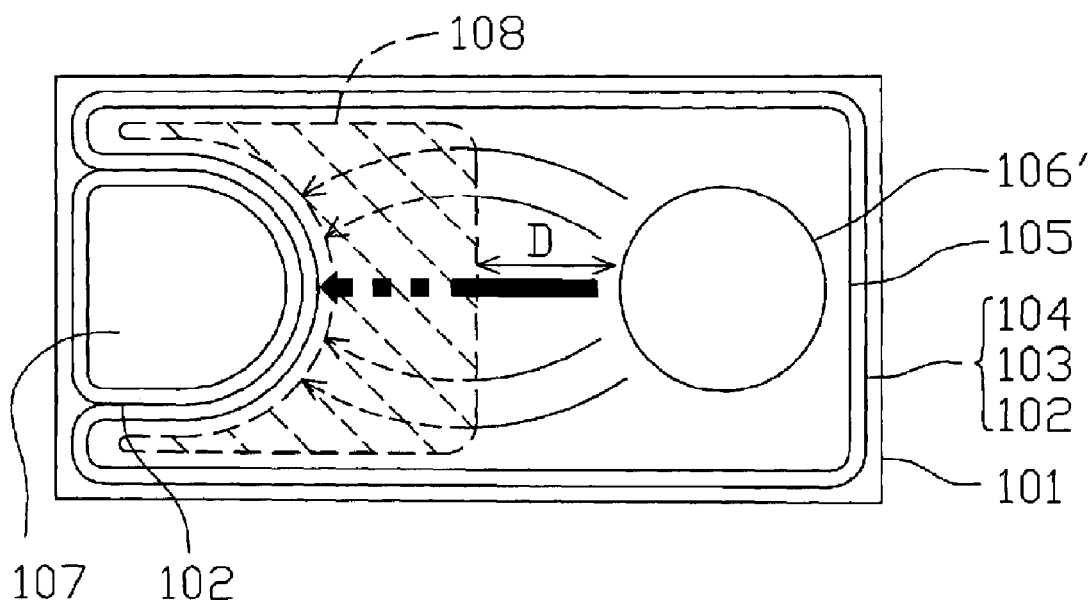
FIG. 2 is a top view showing a second conventional face-up optical semiconductor device.
Figure 3:
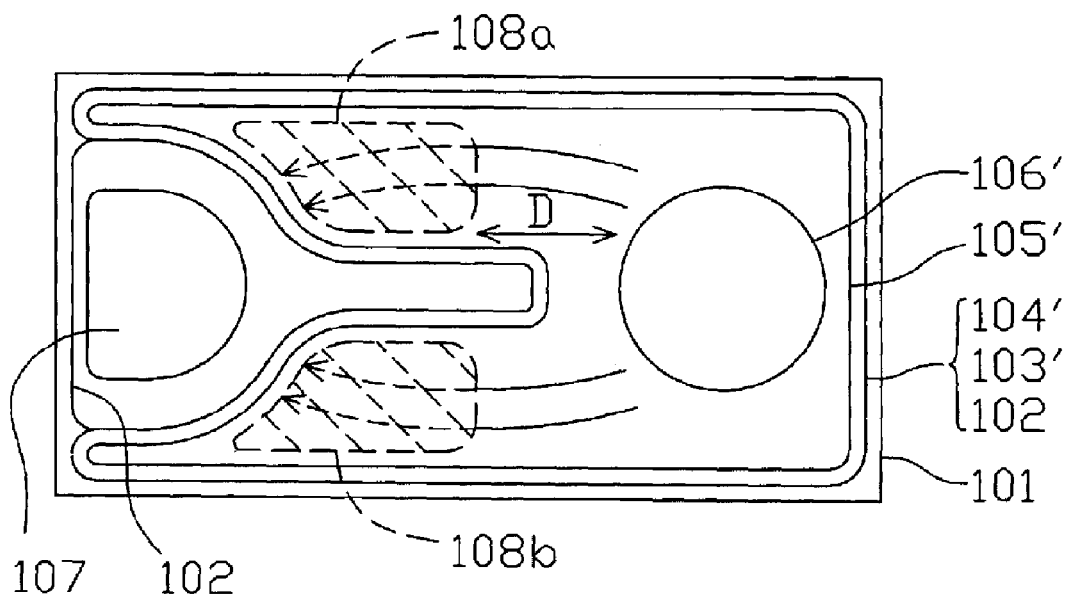
FIG. 3 is a top view showing another conventional face-up optical semiconductor device.
Figure 4A:
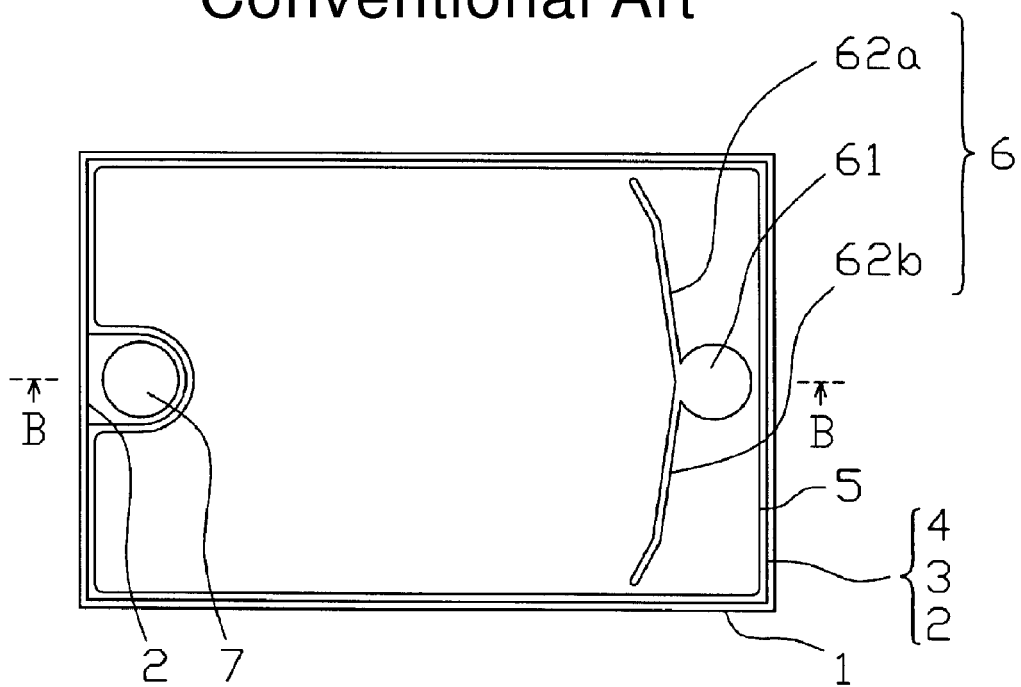
FIGS. 4A and 4B are a top view and a cross sectional view, respectively, showing still another optical semiconductor device as a comparative example where a rectangular face-up optical semiconductor device is provided with a p-side electrode composed of a pad portion and auxiliary electrode portions.
Figure 4B:
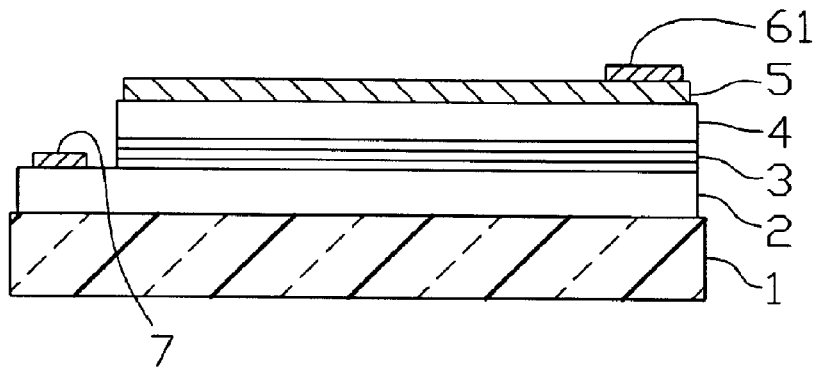
Figure 5:
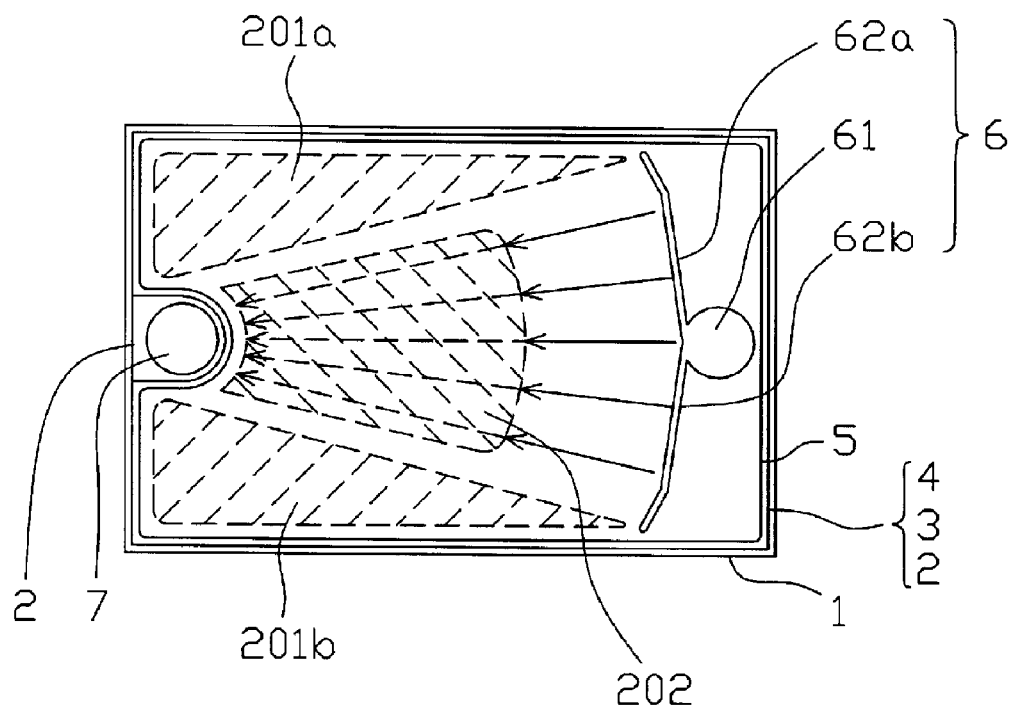
FIG. 5 is a top view illustrating a problem of the face-up optical semiconductor device of FIGS. 4A and 4B.

In FIGS. 6 and 7A to 7C, the basic configuration of the device can be similar to that of the conventional device of FIGS. 4A and 4B while the device can be provided with outside independent electrodes 81a, 81b, 82a, 82b, 83a, and 83b on the transparent electrode layer 5 at regions corresponding to the weak light emission regions 201a and 201b as shown in FIG. 5. The outside independent electrodes 81a, 81b, 82a, 82b, 83a, and 83b can be disposed on a circle having a center located at the n-side electrode 7 or a tangent line of the circle so as to be composed of an arc or linear electrode along the circle or the tangent line. It should be noted that the outside independent electrodes 81a, 81b, 82a, 82b, 83a, and 83b can be disposed on a concentric circle to the above circle or a tangent line of the concentric circle. In this case, the length of each of the outside independent electrodes 81a, 81b, 82a, 82b, 83a, and 83b can be 50 μm or less because, if it is too long, the light emission distribution can become uneven. Accordingly, the present configuration can dispose the outside independent electrodes 81a, 81b, 82a, 82b, 83a, and 83b on the respective same circles or tangent lines, meaning that the distance from the n-side electrode 7 to each of the outside independent electrodes can be substantially the same. By doing so, the outside independent electrodes 81a, 81b, 82a, 82b, 83a, and 83b can be at substantially the same potential.

It should be noted that the outside independent electrodes can be an arc or linear electrode with a constant width, but the presently disclosed subject matter is not limited thereto. In order to prevent the outside independent electrode from being peeled off from the transparent electrode layer 5, the outside independent electrode may be subjected to R-processing at its ends.

The outside independent electrodes 81a, 81b, 82a, 82b, 83a, and 83b can be formed of the same material as that of the p-side electrode 6, but they may be formed of a material such as a metal having a sheet resistance smaller than that of the transparent electrode layer 5. Accordingly, they can be formed at the same time when the p-side electrode 6 is formed, but they should be physically separated from the p-side electrode 6. Furthermore, the outside independent electrodes 81a, 81b, 82a, 82b, 83a, and 83b should also be separated physically from each other.

Figure 8:
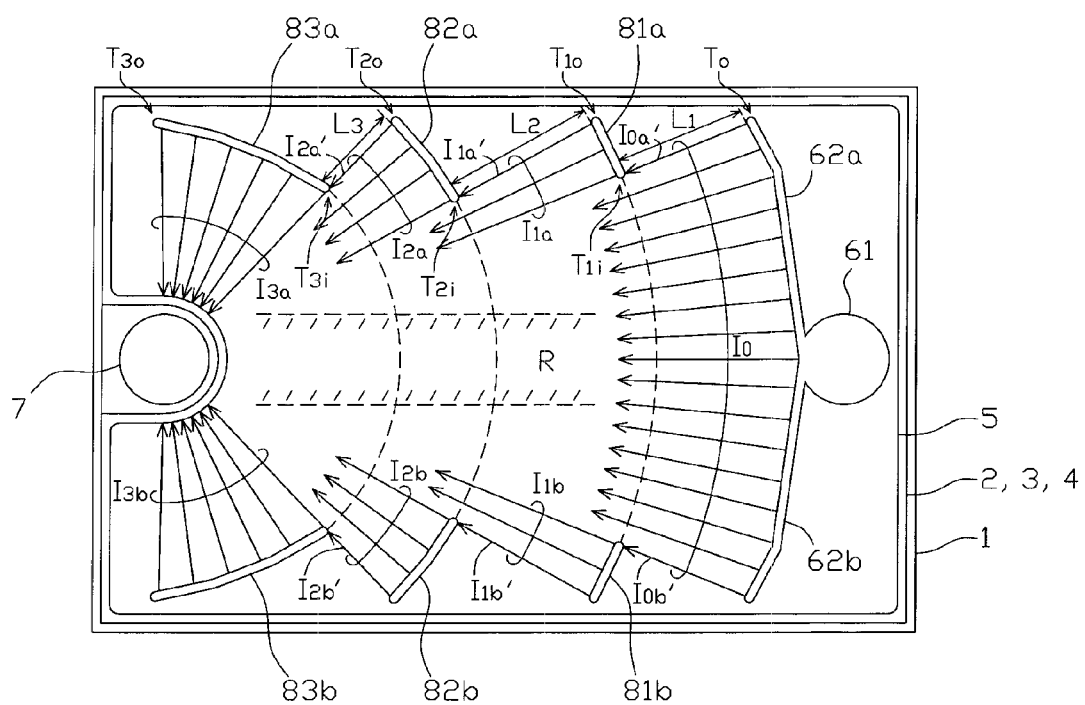
FIG. 8 is an enlarged view of FIG. 7A, illustrating a light emission region of FIG. 6.

FIG. 8 is an enlarged view of FIG. 7A, illustrating the light emission region of FIG. 6. Radial distances $L_1$, $L_2$, and $L_3$ from the n-side electrode 7 to the auxiliary electrode portions 62a and 62b, the outside independent electrodes 81 and 81b, 82a and 82b, and 83a and 83b, respectively, can be determined so that the current density from the respective auxiliary or independent electrodes can become substantially even. It should be noted that the auxiliary electrode portions can be disposed on a circle having a center located at the n-side electrode 7 or a tangent line of the circle so as to be composed of an arc or linear electrode along the circle or the tangent line. Further, when the outside independent electrodes 81a and 81b (82a and 82b, and 83a and 83b) deviate from the circle having the center at the n-side electrode 7, a current may concentrate on a straight line with the shortest distance between the outside independent electrodes 81a and 81b (82a and 82b, and 83a and 83b) and the n-side electrode 7, meaning that the light emission distribution might not become even.

The outside independent electrodes 81 and 81b, 82a and 82b, and 83a and 83b can diffuse part of the current from the p-side electrode 6 to the n-side electrode 7 through the transparent electrode layer 5 toward the ends in the short side direction of the optical semiconductor device, thereby decreasing the weak light emission regions 201a and 201b of FIG. 5. This configuration will be described with reference to FIG. 8, which is an enlarged view of FIG. 7A. In FIG. 8, the solid line arrows show the current flowing through the transparent electrode layer 5, meaning that the regions covered by the solid arrows substantially represent the light emission regions.

Figure 31:
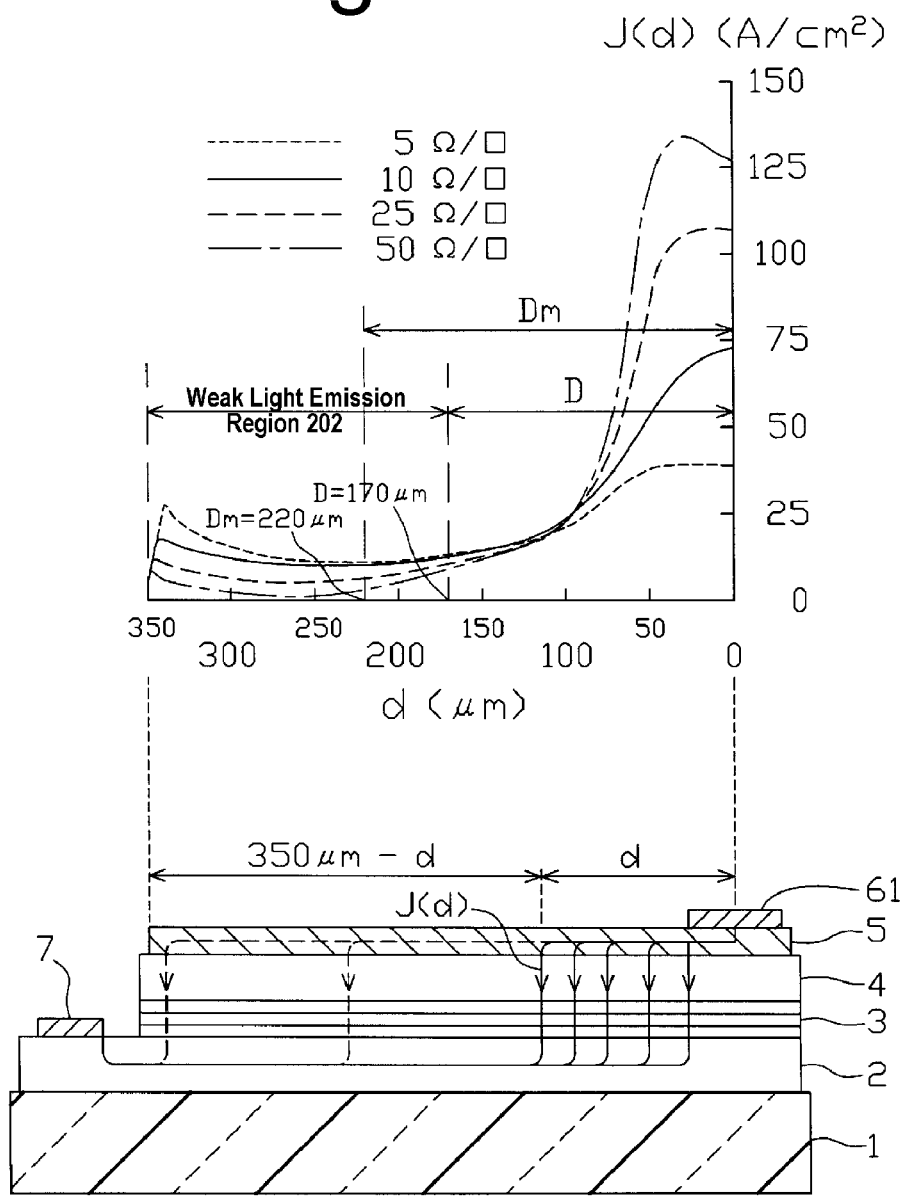
FIG. 31 is a graph for describing the minimum value distance Dm and the current diffusion distance D.

The radial distance to the outside independent electrodes and the auxiliary electrode portions can be set on the basis of the current diffusion state of the conventional example without any additional electrodes like the outer independent electrode. As the conventional example, the optical semiconductor device of FIGS. 4A and 4B can be considered because it lacks independent electrodes. The conventional example, or comparative example, can be determined by simulation so as to show the current diffusion state. This will be described with reference to FIG. 31. As shown in FIG. 31, the current having a current density J(d) (unit: A/cm$^2$) as shown by the solid arrows and the dotted arrows and flowing from the p-side electrode 6 (pad 61) to the n-side electrode 7 can pass by the distance d from the p-side electrode 6 through the transparent electrode layer 5, can perpendicularly pass from the transparent electrode layer 5 through the semiconductor layers (4, 3, and 2), and can pass through the n-type GaN layer 2 by the distance (350 μm-d) to reach the n-side electrode 7. It should be noted that the starting point of the distance d is the center of the p-side electrode pad 61 (d=0). Further, the length of the transparent electrode layer 5 between the p-side electrode and the n-side electrode 7 is 350 μm. In this case, the respective thicknesses of the active layer 3 and the p-type GaN layer 4 are very thin, and accordingly, the current density of the transparent electrode layer 5 in the vertical direction can be approximated to the current density J(d) of the active layer 3. As described above, the current density J(d) can be determined by the sheet resistance of the transparent electrode layer 5 and the contact resistivity between the transparent electrode layer 5 and the semiconductor layer. In particular, the driving voltage $V_d$ between the p-side electrode 6 and the n-side electrode 7 can be expressed by the following expression:

$$V_d = J(d) \cdot r1 + J(d) \cdot \rho_{ITO} \cdot d + J(d) \cdot r2 + J(d) \cdot \rho_{p\text{-}GaN} \cdot t + V_{QW} + J(d) \cdot \rho_{n\text{-}GaN} (350 \text{ μm-d}) + J(d) \cdot r3 \quad (1)$$

where r1 is the contact resistivity between the transparent electrode layer 5 and the p-side electrode 6, for example, is $2 \times 10^{-4}$ Ω·cm$^2$, $\rho_{ITO}$ is the sheet resistance of the transparent electrode layer 5, for example, 10 to 15 Ω/sq., r2 is the contact resistivity between the transparent electrode layer 5 and the p-type GaN layer 4, for example, is $7 \times 10^{-4}$ Ω·cm$^2$, $\rho_{p\text{-}GaN}$ is the sheet resistance of the p-type GaN layer (GaN:Mg) 4 (converted on the basis of the carrier density of $10 \times 10^{18}$/cm$^3$, carrier mobility of 1.45 cm$^2$/V·sec, and thickness of 150 nm), t is the thickness of the p-type GaN layer 4, $V_{QW}$ is the voltage drop in the active layer 3, $\rho_{n\text{-}GaN}$ is the sheet resistance of the n-type GaN layer (GaN:Si) 2 (converted on the basis of the carrier density of $5.0 \times 10^{18}/cm^2$, carrier mobility of $200\ cm^2/V\cdot sec$, and thickness of 6 μm), and r3 is the contact resistivity between the n-type GaN layer 2 and the n-side electrode 7, for example, is $2 \times 10^{-4}\ \Omega \cdot cm^2$.

FIG. 31 is a graph for describing the results of J(d) calculated by a simulation software of SpeCLED (trade name) using the above expression (1) while assuming the current supplied is $I_S$.

Figure 32:
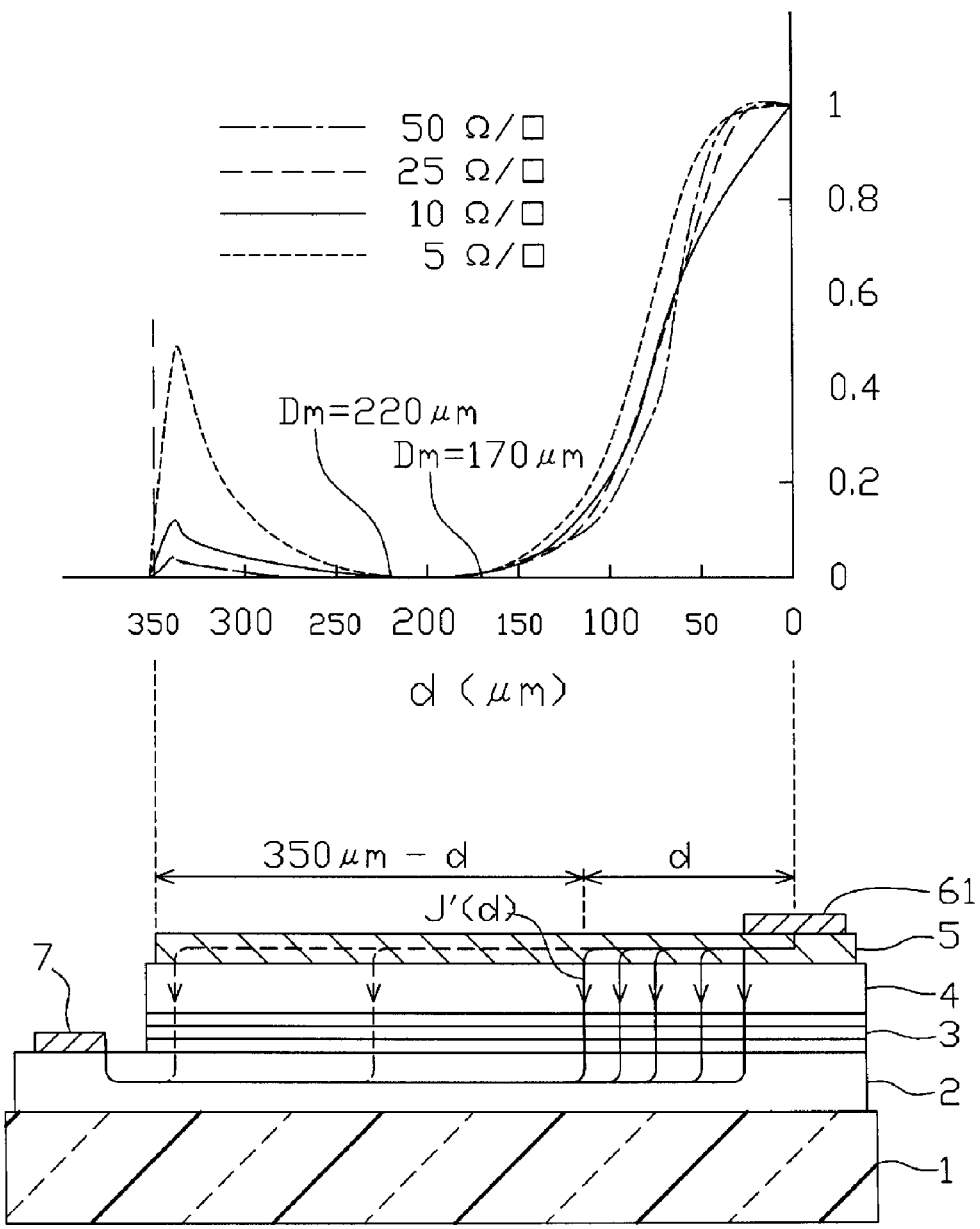
FIG. 32 is a graph obtained by normalizing the graph of FIG. 31.

FIG. 32 is a graph obtained by normalizing the graph of FIG. 31. Specifically, the minimum values of approximately 13 $A/cm^2$, 9 $A/cm^2$, 5 $A/cm^2$, and 2 $A/cm^2$ in the case of the sheet resistance of 5 $\Omega/sq.$, 10 $\Omega/sq.$, 25 $\Omega/sq.$, and 50 $\Omega/sq.$, respectively, are deducted from the current densities J(d) at respective distances d in FIG. 31, respectively. Furthermore, the resulting values are normalized so that the current density at the distance=0 becomes 1, thereby determining the values J'(d) at respective distances. In FIG. 32, the shown curves represent the approximate curves of the resulting J'(d). Namely, the current density J'(d) at respective distances can be represented by the following expression:

$$J'(d)=(J(d)-J(Dm))/(J(0)-J(Dm)).$$

Further, FIGS. 31 and 32 show the calculation results of the current densities J(d) and the value J'(d) in the case of the transparent electrode 5 having the sheet resistance of 5 $\Omega/sq.$, 10 $\Omega/sq.$, 25 $\Omega/sq.$, and 50 $\Omega/sq.$, respectively, while the driving current of the optical semiconductor device is 20 mA. Every curve of the calculation results shows the decrease in current density J(d) from d=0 to d=170 μm with the minimum current density J(d) around d=230 μm. Specifically, as shown in FIG. 31, when the sheet resistance is 5 $\Omega/sq.$, the minimum value J(d) is 13 $A/cm^2$ at d=220 μm. When the sheet resistance is 10 $\Omega/sq.$, the minimum value J(d) is 9 $A/cm^2$ at d=225 μm. Furthermore, when the sheet resistance is 25 $\Omega/sq.$, the minimum value J(d) is 2 $A/cm^2$ at d=230 μm. In this case, the distribution of the current density J(d) almost conforms to the light emission distribution of the optical semiconductor device. In other words, the area at the distance d where the current density J(d) is minimum is the most weak light emission area. Hereafter, this distance will be represented by "Dm" and referred to as "minimum value distance."

Here, the maximum distance where the current density is sufficient for that area not to become a weak light emission area is referred to as "current diffusion distance D." The weak light emission area starts at a position slightly shorter than the minimum value distance Dm. According to FIG. 32, the calculation results shows J'(d) being zero (0) toward around 175 μm for every sheet resistance. Taking this into consideration, the current diffusion distance can be estimated as 170 μm. Furthermore, when the difference between the current density just below the center of the pad portion and that of the minimum value is assumed to be 1, the difference between the current density and its minimum value within the current diffusion distance D (namely, J'(d)) is 0.01 or greater. In other words, the current diffusion distance D is the distance where J'(d) is at least 0.01. Suppose that the transparent electrode 5 is formed from an indium tin oxide (ITO) having a sheet resistance of 10 $\Omega/sq.$ and a thickness of approximately 200 nm, and that the contact resistivity between the transparent electrode layer 5 and the p-type GaN layer 4 is approximately $7 \times 10^{-4}\ \Omega \cdot cm^2$. In this case the current diffusion distance D can be derived as 170 μm.

Taking the electric and optical characteristics into consideration, the transparent electrode layer 5 of the optical semiconductor device can have a sheet resistance of approximately 10 $\Omega/sq.$ to 25 $\Omega/sq.$ from a practical standpoint. Furthermore, the contact resistivity between the transparent electrode layer 5 and the p-type GaN layer 4 with the standard driving current of 20 mA can be approximately $5 \times 10^{-4}\ \Omega \cdot cm^2$ to $7 \times 10^{-3}\ \Omega \cdot cm^2$. If the contact resistivity exceeds this range, the forward voltage during operation may be too large, resulting in decrease of light emission efficiency of the optical semiconductor device. Whereas, if the contact resistivity is below this range, the forward voltage during operation may become small, and the current diffusion distance D becomes remarkably small. In order to cause the current to be diffused over all or most of the optical semiconductor device, the transparent electrode layer 5 must or should have a sheet resistance lower than 5 $\Omega/sq.$, but this can be difficult to form. Accordingly, the sheet resistance of the transparent electrode layer 5 can be approximately 10 $\Omega/sq.$ to 25 $\Omega/sq.$, the contact resistivity between the transparent electrode layer 5 and the p-type GaN layer 4 can be approximately $5 \times 10^{-4}\ \Omega \cdot cm^2$ to $7 \times 10^{-3}\ \Omega \cdot cm^2$, and Dm=225 μm and D=170 μm.

Namely, the outside independent electrodes 81a and 81b can receive parts $I_{0a}'$ and $I_{0b}'$ of the current $I_0$ flowing from the auxiliary electrode portions 62a and 62b of the p-side electrode 6 toward the n-side electrode 7 within the transparent electrode layer 5, respectively, and can diffuse the same into the transparent electrode layer 5 at the short side ends of the optical semiconductor device as currents $I_{1a}$ and $I_{1b}$. In this case, in order for the outside independent electrodes 81a and 81b to reliably receive currents from the auxiliary electrode portions 62a and 62b via the transparent electrode layer 5, the radial distance $L_1$ between the auxiliary electrode portion 62a (62b) and the outside independent electrode 81a (81b) can be set smaller than the minimum value distance Dm (=220 μm). In another example, the radial distance $L_1$ can be set smaller than the current diffusion distance D (=170 μm). Namely, the relationship therebetween can be set to satisfy $L_1<Dm$ or $L_1<D$. For example, $L_1$ can be set to 100 μm. At the same time, the inside end portion $T_{1i}$ of the outside independent electrode 81a (81b) can be disposed on, or nearer the center than, the intersection between the line connecting the outside end portion $T_o$ of the auxiliary electrode portion 62a and the center of the n-side electrode 7 and the circle along which the outside independent electrodes 81a and 81b are formed. It should be noted that the light extraction efficiency can be improved as the outside independent electrodes 81a and 81b get shorter. However, the more the outside independent electrodes 81a and 81b extend toward the center side, the more the current flow concentrates, thereby causing the light emission distribution to be uneven. For example, if the inside end portion $T_{1i}$ of the outside independent electrode 81a (81b) closest to the auxiliary electrode portion 62 extends toward the area R interposed between the pad portion 61 of the p-side electrode 6 and the n-side electrode 7, the current may flow into the inside end portion $T_{1i}$ of the outside independent electrode 81a (81b) before sufficiently diffusing to the outside end portion $T_o$ of the auxiliary electrode portion 62a (62b). Accordingly, this may not be advantageous in view of the light emission distribution. In order to appropriately achieve the divided current flow ratio of $I_{0a}'/I_0$ and $I_{0b}'/I_0$, it can be advantageous to dispose the inside end portion $T_{1i}$ of the outside independent electrode 81a (81b) on, or nearer the center than, the intersection between the line connecting the outside end portion $T_o$ of the auxiliary electrode portion 62 and the center of the n-side electrode 7 and the circle along which the outside independent electrodes 81a and 81b are formed. Taking the light extraction efficiency into consideration, it can be advantageous to dispose the inside end portion $T_{1i}$ of the outside independent electrode 81a (81b) on the intersection. If the outside independent electrodes 81a and 81b are line-symmetrically disposed so that $I_{0a}'$ equals to $I_{0b}'$, the current distribution can be well balanced to even the light emission distribution.

Further, the outside independent electrodes 82a and 82b can receive parts $I_{1a}'$ and $I_{1b}'$ of the current $I_{1a}$ and $I_{1b}$ flowing from the outside independent electrodes 81a and 81b toward the n-side electrode 7 within the transparent electrode layer 5, respectively, and can diffuse the same into the transparent electrode layer 5 at the short side ends of the optical semiconductor device as currents $I_{1a}$ and $I_{2b}$. In this case, in order for the outside independent electrodes 82a and 82b to reliably receive currents from the outside independent electrodes 81a and 81b via the transparent electrode layer 5, the radial distance $L_2$ between the outside independent electrode 81a (81b) and the outside independent electrode 82a (82b) can be set smaller than the minimum value distance Dm (=220 μm). In another embodiment, the radial distance $L_2$ can be set smaller than the current diffusion distance D (=170 μm). Namely, the relationship therebetween can be set to satisfy $L_2$<Dm or $L_2$<D. For example, $L_2$ can be set to 100 μm. At the same time, the inside end portion $T_{2i}$ of the outside independent electrode 82a (82b) can be disposed on, or nearer the center than, the intersection between the line connecting the outside end portion $T_{1o}$ of the outside independent electrode 81a and the center of the n-side electrode 7 and the circle along which the outside independent electrodes 82a and 82b are formed. It should be noted that the light extraction efficiency can be improved as the outside independent electrodes 82a and 82b get shorter. However, the more the outside independent electrodes 82a and 82b extend toward the center side, the more the current flow concentrates, thereby causing the light emission distribution to be uneven. In order to appropriately achieve the divided current flow ratio of $I_{1a}'/I_{1a}$ and $I_{1b}'/I_{1b}$, it can be advantageous to dispose the inside end portion $T_{2i}$ of the outside independent electrode 82a (82b) on, or nearer the center than, the intersection. On the other hand, in order to maximize the light emission regions by the currents $I_{2a}$ and $I_{2b}$ from the outside independent electrode 82a and 82b, the outside end portions $T_{2o}$ of the outside independent electrodes 82a and 82b can extend close to the longitudinal side surfaces of the optical semiconductor device.

Further, the outside independent electrodes 83a and 83b can receive parts $I_{2a}'$ and $I_{2b}'$ of the current $I_{2a}$ and $I_{2b}$ flowing from the outside independent electrodes 82a and 82b toward the n-side electrode 7 within the transparent electrode layer 5, respectively, and can diffuse the same into the transparent electrode layer 5 at the short side ends of the optical semiconductor device as currents $I_{3a}$ and $I_{3b}$. In this case, in order for the outside independent electrodes 83a and 83b to surely receive currents from the outside independent electrodes 82a and 82b via the transparent electrode layer 5, the radial distance $L_3$ between the outside independent electrode 82a (82b) and the outside independent electrode 83a (83b) can be set smaller than the minimum value distance Dm (=220 μm). In another embodiment, the radial distance $L_3$ can be set smaller than the current diffusion distance D (=170 μm). Namely, the relationship therebetween can be set to satisfy $L_3$<Dm or $L_3$<D. For example, $L_3$ can be set to 45 μm. At the same time, the inside end portion $T_{3i}$ of the outside independent electrode 83a (83b) can be disposed on, or nearer the center than, the intersection between the line connecting the outside end portion $T_{2o}$ of the outside independent electrode 82a and the center of the n-side electrode 7 and the circle along which the outside independent electrodes 83a and 83b are formed. It should be noted that the light extraction efficiency can be improved as the outside independent electrodes 83a and 83b get shorter. However, the more the outside independent electrodes 83a and 83b extend toward the center side, the more the current flow concentrates, thereby causing the light emission distribution to be uneven. In order to appropriately achieve the divided current flow ratio of $I_{2a}'/I_{2a}$ and $I_{2b}'/I_{2b}$, it can be advantageous to dispose the inside end portion $T_{3i}$ of the outside independent electrode 83a (83b) on, or nearer the center than, the intersection. On the other hand, in order to maximize the light emission regions by the currents $I_{3a}$ and $I_{3b}$ from the outside independent electrode 83a and 83b, the outside end portions $T_{3o}$ of the outside independent electrodes 83a and 83b can extend close to the longitudinal side surfaces of the optical semiconductor device.

Note that in FIG. 8, the current flows from the auxiliary electrode portions 62a and 62b, and the outside independent electrodes 81a, 81b, 82a, 82b, 83a and 83b toward the n-side electrode 7 are shown straightforwardly, but actually they can diffuse in the plane direction of the transparent electrode layer 5 slightly. Accordingly, although the inside end portions of the outside independent electrodes 81a, 81b, 82a, 82b, 83a and 83b can be positioned on the corresponding intersections as described above, they can be shifted slightly.

As described above, it can be advantageous to set the radial distances $L_1$, $L_2$ and $L_3$ for the auxiliary electrode portions 62a and 62b, and the outside independent electrodes 81a, 81b, 82a, 82b, 83a and 83b smaller than the minimum value distance Dm. In another embodiment, the radial distances $L_1$, $L_2$ and $L_3$ can be set smaller than the current diffusion distance D. For example, they can be set to 15 to 90% of the current diffusion distance D. In another exemplary embodiment, these values can be set to 20 to 80% thereof. If the radial distances $L_1$, $L_2$ and $L_3$ are too short, the current might not only pass through the active layer 3 to be diffused through the transparent electrode layer 5 and increase the weak light emission regions, but also the transparent electrode 5 is, as a result, covered with the multiple outside independent electrodes, thereby decreasing the light extraction efficiency. In view of this, the radial distances $L_1$, $L_2$ and $L_3$ can be at least 20 μm. If the radial distances $L_1$, $L_2$ and $L_3$ are too large, the amount of current flowing through the outside independent electrodes near the n-side electrode 7 might be decreased, thereby increasing the corner weak light emission regions near the n-side electrode 7.

The method for manufacturing the face-up optical semiconductor device of FIGS. 6 and 7A to 7C will now be described with reference to FIG. 9.

First, in Step 401, an n-GaN layer 2, an active layer 3 serving as a light emission layer, and a p-type GaN layer 4 can be epitaxially grown sequentially on a C-plane sapphire growth substrate 1 by a metal oxide chemical vapor deposition method (MOCVD).

Specifically, the C-plane sapphire growth substrate on which $Al_xIn_yGa_zN$ ($0 \leq x \leq 1$, $0 \leq y \leq 1$, $0 \leq z \leq 1$, x+y+z=1) can be grown can be transferred to an MOCVD apparatus, where thermal cleaning can be carried out in a hydrogen atmosphere at approximately 1000° C. for about 10 minutes. Then, trimethyl gallium (TMG) (10.4 μmol/min) and $NH_3$ (3.3 LM (litter in standard state/min)) can be supplied at approximately 500° C. for about 3 minutes to grow a low-temperature GaN buffer layer (not shown). Then, the temperature can be raised to approximately 1000° C. and maintained for about 30 seconds to crystallize the low-temperature GaN buffer layer. At the same temperature, TMG (45 μmol/min) and $NH_3$ (4.4 LM) can be supplied for about 20 minutes to grow a foundation GaN layer (not shown) having a thickness of approximately 1 μm. TMG (45 μmol/min), $NH_3$ (4.4 LM), and $SiH_4$ ($2.7 \times 10^{-9}$ μmol/min) can be supplied at approximately 1000°

C. for about 90 minutes to grow an n-type GaN layer 2 with a thickness of approximately 6 μm.

In this embodiment, a multi quantum well (MQW) structure including InGaN/GaN serving as an active layer 3 can be employed. In order to form the MQW structure, first, TMG (3.6 μmol/min), trimethyl indium (TMI) (10 μmol/min), and NH$_3$ (4.4 LM) can be supplied at approximately 700° C. for about 33 seconds to grow an InGaN well layer with a thickness of approximately 2.2 nm. Then, at the same temperature, TMG (3.6 μmol/min) and NH$_3$ (4.4 LM) can be supplied for about 320 seconds to grow a GaN barrier layer with a thickness of approximately 15 nm. This cycle can be repeated for five times to form the MQW structure. Note that the active layer 3 may have a single quantum well structure or a single layer structure.

Next, the temperature can be raised to approximately 870° C., and then TMG (8.1 μmol/min), trimethyl aluminum (TMA) (7.5 μmol/min), NH$_3$ (4.4 LM) and biscyclopentadienyl magnesium (Cp$_2$MG) (2.9×10$^{-7}$ μmol/min) can be supplied for about 5 minutes to grow a p-type AlGaN cladding layer (not shown) with a thickness of approximately 40 nm. Consecutively, TMG (18 μmol/min), NH$_3$ (4.4 LM) and biscyclopentadienyl magnesium (Cp$_2$MG) (2.9×10$^{-7}$ μmol/min) can be supplied for about 7 minutes to grow a p-type GaN layer 4 with a thickness of approximately 150 nm.

Next, in Step 402, part of the n-type GaN layer 2 can be exposed by a photolithography/etching method. Specifically, a photoresist pattern can be formed on a region other than regions where the n-type GaN layer 2 is to be exposed. Then, in a reactive ion etching (RIE) device, parts of the p-type GaN layer 4, active layer 3 and n-type GaN layer 2 are removed, and the photoresist pattern can be removed.

Next, in Step 403, a transparent electrode layer 5 can be formed.

Specifically, a transparent electrode made of an indium tin oxide (ITO) with a thickness of approximately 220 nm can be formed over all or most of the wafer. Next, a photoresist matter can be formed on the transparent electrode layer by photolithography, and can be immersed in a solution of etchant ITO02 (trademark) for ITO manufactured by Kanto Kagaku at 40° C. for 30 to 500 seconds to remove any unnecessary transparent electrode layer, thereby completing the transparent electrode layer 5. Then, the photoresist pattern can be removed. The resulting workpiece can be subjected to heat treatment in an oxygen atmosphere at 600° C. for one minute to oxidize the transparent electrode layer 5, thereby improving the light transmitting property.

Examples of the material for the transparent electrode layer 5 can include, in addition to ITO, oxides of In, Sn, Zn, or a mixture of two or more of them, and AuNi, and the like. Examples of the film formation method include EB vapor deposition, sputtering, arc-discharge ion plating, and the like. In view of the film quality and effects on wafers, it can be advantageous to use arc-discharge ion plating as wafers are not directly exposed to plasma.

Next, in Step 404, a lift-off method is carried out to form the p-side electrode 6 including the pad portion 61 and the auxiliary electrode portions 62*a* and 62*b*, and the outside independent electrodes 81*a*, 81*b*, 82*a*, 82*b*, 83*a*, and 83*b*.

Specifically, a photoresist pattern is formed by photolithography. Then, EB vapor deposition or the like method is carried out to deposit Ti with a thickness of approximately 10 angstrom and Al, Pt or Rh with a thickness of approximately 10000 angstrom in this order. Next, the photoresist pattern is removed to pattern the deposited layers. Note that Pt or Rh has a high reflectance with respect to blue light emitted from the active layer 3 and a contact resistivity with ITO. As such, this material can be an advantageous aspect of the presently disclosed subject matter.

Next, in Step 405, a lift-off method can be carried out to form the n-side electrode 7.

Specifically, a photoresist pattern can be formed by photolithography at a region where the n-side electrode 7 is not formed. Then, EB vapor deposition or a like method can be carried out to deposit Ti with a thickness of approximately 10 angstrom and Al with a thickness of approximately 10000 angstrom in this order. Next, the photoresist pattern can be removed to pattern the deposited layers. Note that if the n-side electrode 7 is designed to have the same structure as those of the p-side electrode 6 and the outside independent electrodes 81*a*, 81*b*, 82*a*, 82*b*, 83*a*, and 83*b*, the n-side electrode 7 can be formed at the same time when the p-side electrode 6 and the outside independent electrodes 81*a*, 81*b*, 82*a*, 82*b*, 83*a*, and 83*b* are formed in Step 404.

Lastly, in Step 406, the optical semiconductor devices on the wafer can be independently separated by dicing, scribing/braking, laser irradiation or the like to form chips. Then, the optical semiconductor device can be mounted on a printed board, a submount, or the like so that the surface of the sapphire substrate 1 faces to the printed board or the like, and the pad portion 61 of the p-side electrode 6 and the n-side electrode 7 can be electrically connected by bonding wires to terminals of the printed board or the like.

Figure 10A:
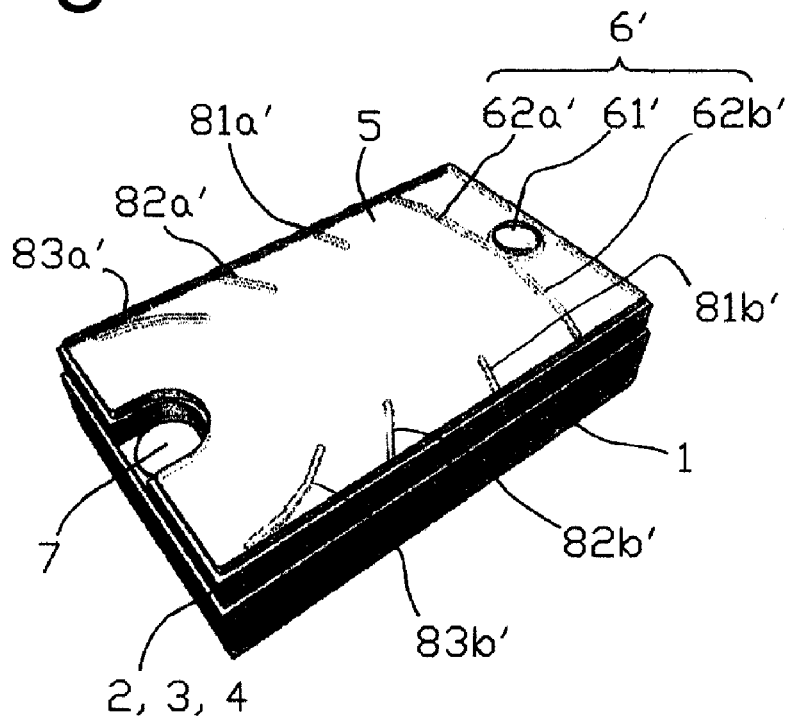
FIGS. 10A and 10B are a perspective view and a partially cut perspective view of a first modification of the face-up optical semiconductor device of FIG. 6, respectively.
Figure 10B:
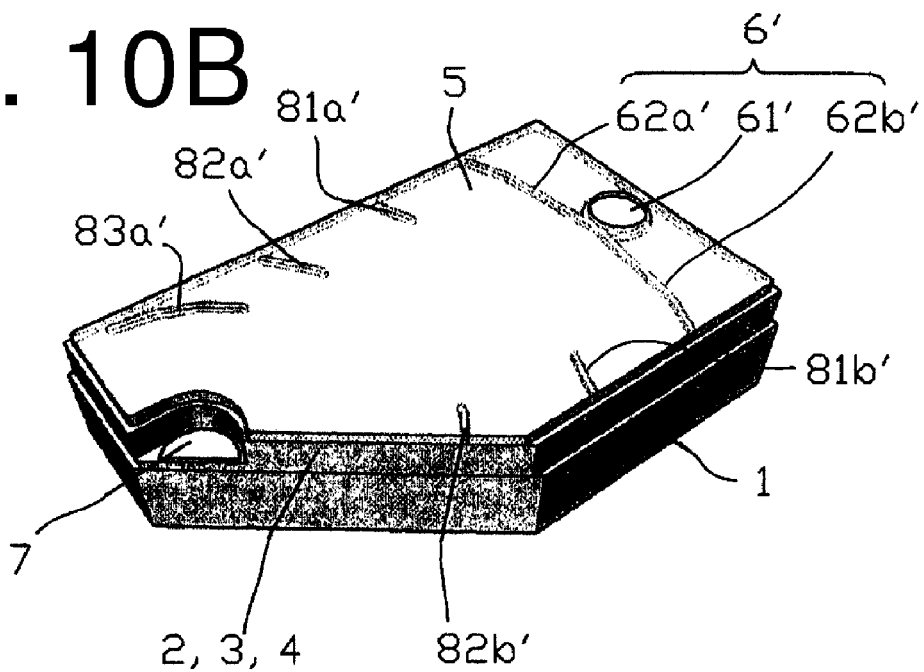
Figure 11A:
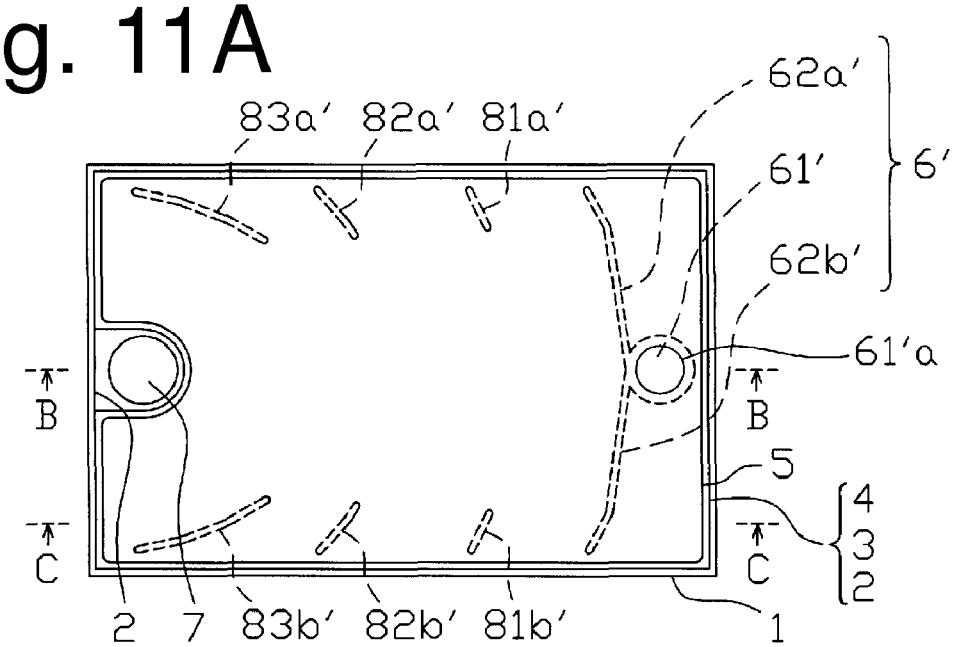
FIGS. 11A, 11B, and 11C are a top view, a cross sectional view taken along the line B-B in FIG. 11A, and a cross sectional view taken along the line C-C in FIG. 11A, respectively, showing the details of the face-up optical semiconductor device of FIGS. 10A and 10B.
Figure 11B:
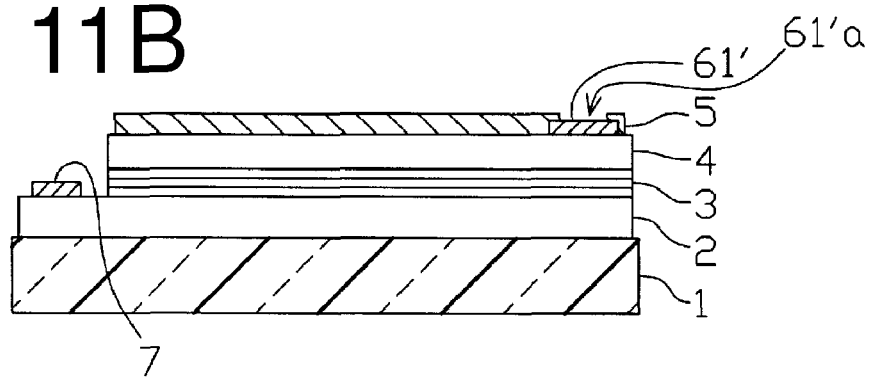
Figure 11C:
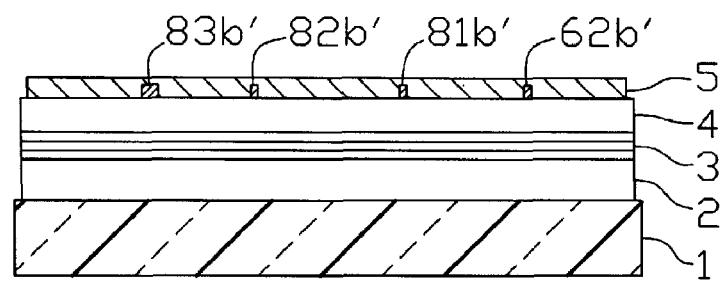

FIGS. 10A and 10B are a perspective view and a partially cut perspective view of a first modification of the face-up optical semiconductor device of FIG. 6, respectively. FIGS. 11A, 11B, and 11C are a top view, a cross sectional view taken along the line B-B in FIG. 11A, and a cross sectional view taken along the line C-C in FIG. 11A, respectively, showing the details of the face-up optical semiconductor device of FIGS. 10A and 10B.

In FIGS. 10A and 10B and 11A to 11C, a p-side electrode 61' including a pad portions 61' and auxiliary electrode portions 62*a'* and 62*b'* and outside independent electrodes 81*a'*, 81*b'*, 82*a'*, 82*b'*, 83*a'*, and 83*b'* can be formed underneath the transparent electrode layer 5. In this case although the auxiliary electrode portions 62*a'* and 62*b'* of the p-side electrode 6' and the outside independent electrodes 81*a'*, 81*b'*, 82*a'*, 82*b'*, 83*a'*, and 83*b'* are each formed from a thin line with a width of about 1 μm to 10 μm, they are covered with the transparent electrode layer 5. This means the transparent electrode layer 5 can hold them from above, thereby preventing them from being peeled off. Further, in this case, the transparent electrode layer 5 can be formed thicker than the auxiliary electrode portions 62*a'* and 62*b'* and the outside independent electrodes 81*a'*, 81*b'*, 82*a'*, 82*b'*, 83*a'*, and 83*b'*. If the transparent electrode layer 5 is made thinner than these electrodes, the sheet resistance of these electrodes might be limited in accordance with the thickness of the transparent electrode layer 5.

In this case, the p-side electrode 6' and the outside independent electrodes 81*a'*, 81*b'*, 82*a'*, 82*b'*, 83*a'*, and 83*b'* can be non-ohmic in order to prevent current from directly flowing through the immediately below semiconductor layers (2, 3, 4). In order to impart the non-ohmic property, the p-side electrode 6' and the outside independent electrodes 81*a'*, 81*b'*, 82*a'*, 82*b'*, 83*a'*, and 83*b'* can be formed from Al, Rh, or an alloy thereof having a high reflectivity to the light emitted from the active layer 3. Al, Rh, or an alloy thereof can be formed by EB vapor deposition, sputtering, and the like. Although the p-side electrode 6' and the outside independent electrodes 81*a'*, 81*b'*, 82*a'*, 82*b'*, 83*a'*, and 83*b'* can be formed from Ag or an alloy thereof that is the most suitable in view of high reflectance and optical extraction efficiency, in this case the surface of the p-type GaN layer 4 of the semiconductor layer should be subjected to plasma treatment in advance by an RIE apparatus or the like in order to increase the resistance thereof, thereby achieving non-ohmic contact.

Next, with reference to FIG. 12 being a flow chart a method for manufacturing the face-up optical semiconductor device of FIGS. 10A to 11C will be described.

Figure 9:
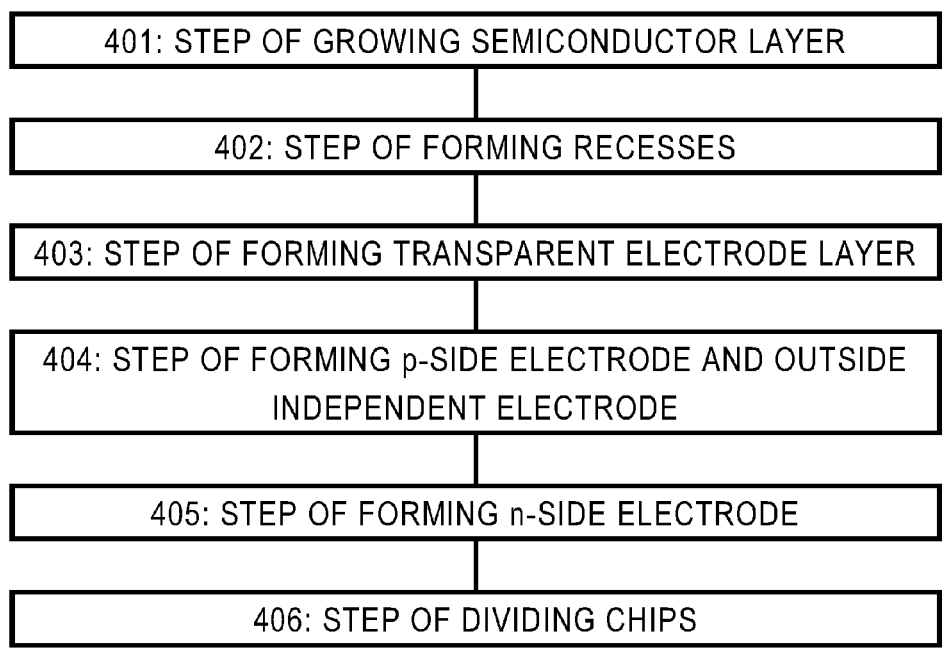
FIG. 9 is a flow chart describing a method for manufacturing the face-up optical semiconductor device of FIGS. 6 to 7C.

As shown in the flow chart, Step 404 of forming a p-side electrode and outside independent electrodes as shown in FIG. 9 can be carried out prior to Step 403 of forming a transparent electrode layer. Then, Step 701 of forming an opening portion can be carried out, which is not included in FIG. 9. Step 701 of forming an opening portion can be carried out to form an opening portion 61'a in the transparent electrode layer 5 to expose the pad portion 61' of the p-side electrode 6' as shown in FIG. 11B. Then, Step 405 of forming an n-side electrode and Step 406 of separating respective devices in FIG. 9 can be carried out.

When compared with the case of manufacturing the face-up optical semiconductor device of FIGS. 6 to 7C, the case of manufacturing the face-up optical semiconductor device of FIGS. 10A to 11C can employ the additional step 701 of forming an opening portion in order to expose the pad portion 61'. In this case, if the transparent electrode layer 5 over the pad portion 61' (at the region of the opening portion 61'a) can be removed in Step 403 of forming a transparent electrode layer where any unnecessary regions of the transparent electrode layer are removed, Step 701 of forming an opening portion can be omitted.

Figure 13:
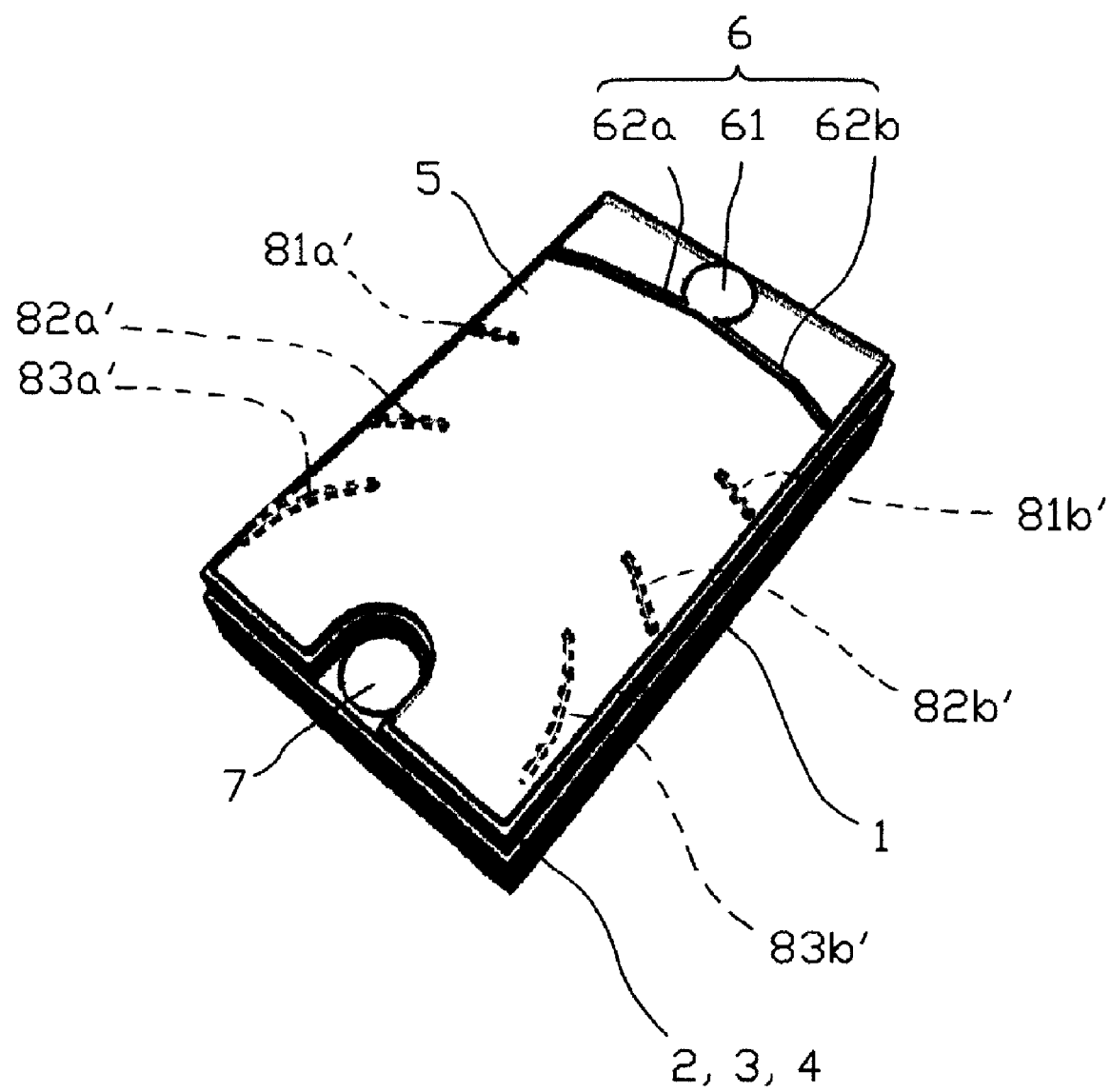
FIG. 13 is a perspective view of a second modification of the face-up optical semiconductor device of FIG. 6.
Figure 14A:
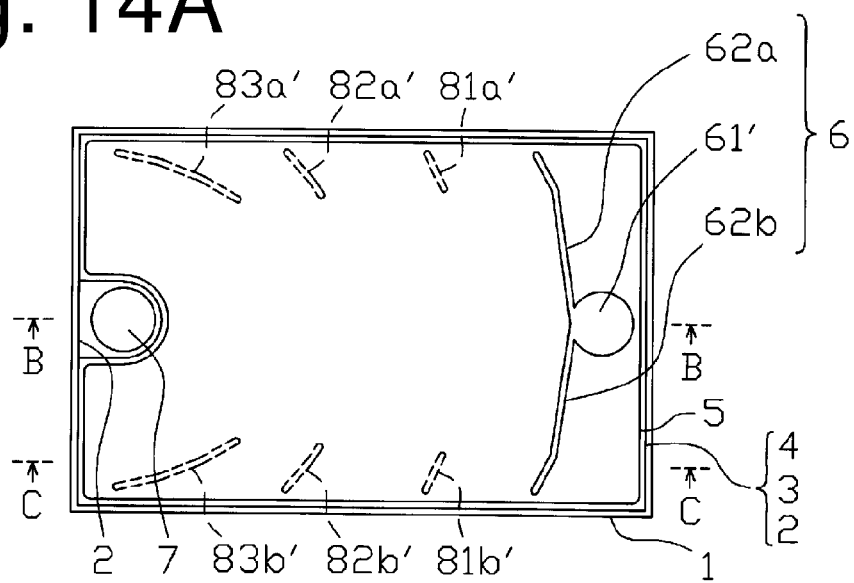
FIGS. 14A, 14B, and 14C are a top view, a cross sectional view taken along the line B-B in FIG. 14A, and a cross sectional view taken along the line C-C in FIG. 14A, respectively, showing the details of the face-up optical semiconductor device of FIG. 13.
Figure 14B:
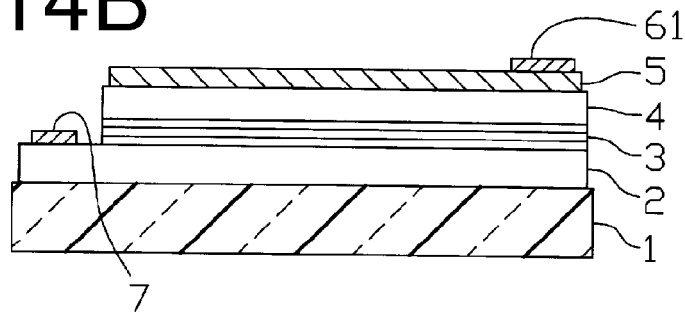
Figure 14C:
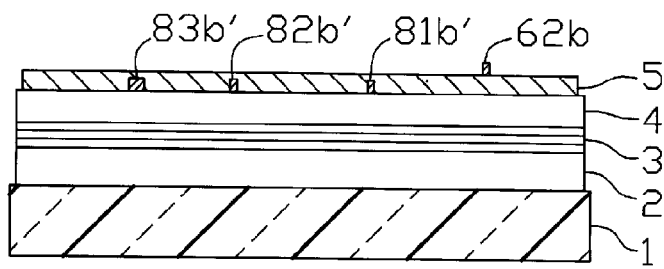

FIG. 13 is a perspective view of a second modification of the face-up optical semiconductor device of FIG. 6. FIGS. 14A, 14B, and 14C are a top view, a cross sectional view taken along the line B-B in FIG. 14A, and a cross sectional view taken along the line C-C in FIG. 14A, respectively, showing the details of the face-up optical semiconductor device of FIG. 13.

In FIGS. 13 to 14C, the p-side electrode 6 including the pad portion 61 and the auxiliary electrode portions 62a and 62b can be formed on the transparent electrode layer 5 while the outside independent electrodes 81a', 81b', 82a', 82b', 83a', and 83b' can be formed underneath the transparent electrode layer 5. Accordingly, any step of exposing the pad portion 61 of the p-side electrode 6 can be omitted, and the outside independent electrodes 81a', 81b', 82a', 82b', 83a', and 83b' that are each formed from a thin line with a width of about 1 μm to 10 μm are covered with the transparent electrode layer 5, whereby the transparent electrode layer 5 can hold these electrodes from above and prevents them from being peeled off. Further, in this case, the transparent electrode layer 5 can be formed thicker than the auxiliary electrode portions 62a' and 62b' and the outside independent electrodes 81a', 81b', 82a', 82b', 83a', and 83b'. If the transparent electrode layer 5 is made thinner than these electrodes, the sheet resistance of these electrodes can be limited in accordance with the thickness of the transparent electrode layer 5.

In this case, only the outside independent electrodes 81a', 81b', 82a', 82b', 83a', and 83b' can be non-ohmic in order to prevent current from directly flowing through the immediate below semiconductor layers (2, 3, 4). Accordingly, the outside independent electrodes 81a', 81b', 82a', 82b', 83a', and 83b' can be formed from Al, Rh, or an alloy thereof being non-ohmic to the p-type GaN layer 4 and having a high reflectivity to the light emitted from the active layer 3. Although the outside independent electrodes 81a', 81b', 82a', 82b', 83a', and 83b' can be formed from Ag or an alloy thereof that is the most suitable in view of high reflectance and optical extraction efficiency, in this case the surface of the p-type GaN layer 4 of the semiconductor layer at the regions where the outside independent electrodes are formed should be subjected to plasma treatment in advance by an RIE apparatus or the like in order to increase the resistance thereof, thereby achieving non-ohmic contact.

Next, with reference to FIG. 15 being a flow chart a method for manufacturing the face-up optical semiconductor device of FIGS. 13 to 14C will be described.

Figure 15:
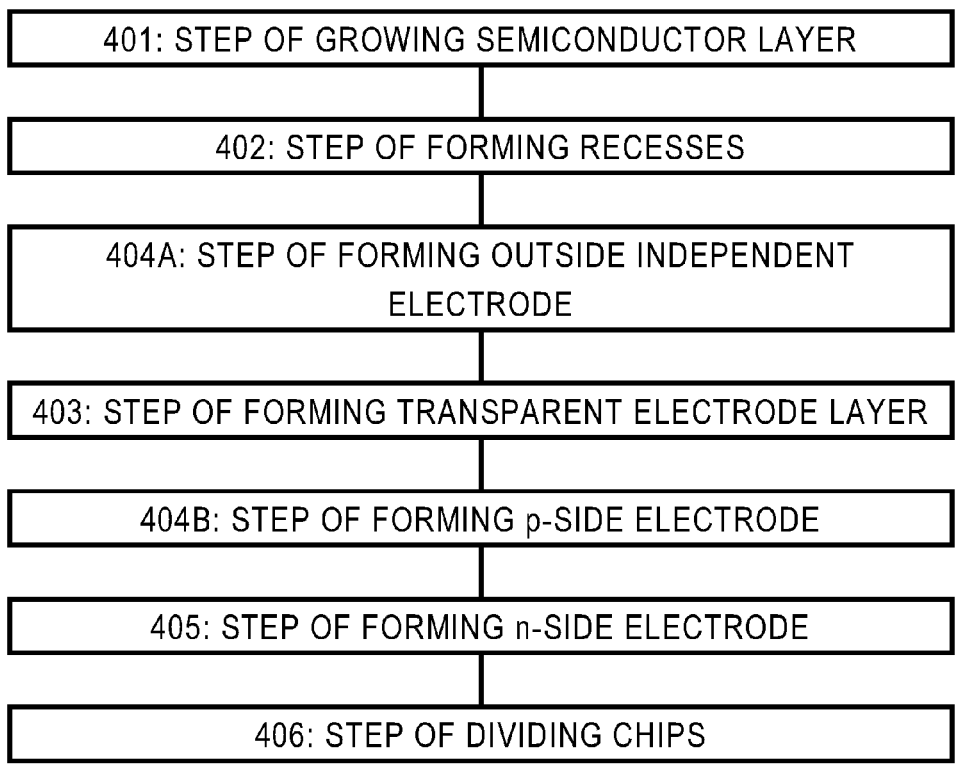
FIG. 15 is a flow chart describing a method for manufacturing the face-up optical semiconductor device of FIGS. 13 to 14C.

As shown in the flow chart, Step 404A of forming outside independent electrodes as shown in FIG. 15 can be carried out prior to Step 403 of forming a transparent electrode layer, thereby forming the outside independent electrodes 81a', 81b', 82a', 82b', 83a', and 83b'. Then, after the completion of Step 403, Step 404B of forming a p-side electrode can be carried out to form the p-side electrode 6.

When compared with the case of manufacturing the face-up optical semiconductor device of FIGS. 6 to 7C, the case of manufacturing the face-up optical semiconductor device of FIGS. 13 to 14C can employ the separate Steps of manufacturing a p-side electrode 6 and of manufacturing the outside independent electrodes 81a', 81b', 82a', 82b', 83a', and 83b'. Note that the face-up optical semiconductor device of FIGS. 13 to 14C can be manufactured by forming part of the outside independent electrodes on the transparent electrode layer 5 and remaining part of the outside independent electrodes underneath the transparent electrode layer 5. In this case, taking the current flowing from the upper side to the lower side within the transparent electrode layer 5 in the thickness direction thereof into consideration, the outside independent electrodes near the p-side electrode 6, for example, 81a' and 81b', can be formed on the transparent electrode layer 5 while the outside independent electrodes near the n-side electrode 7, for example, 82a' and 82b' and 83a' and 83b', can be formed underneath the transparent electrode layer 5.

Figure 16:
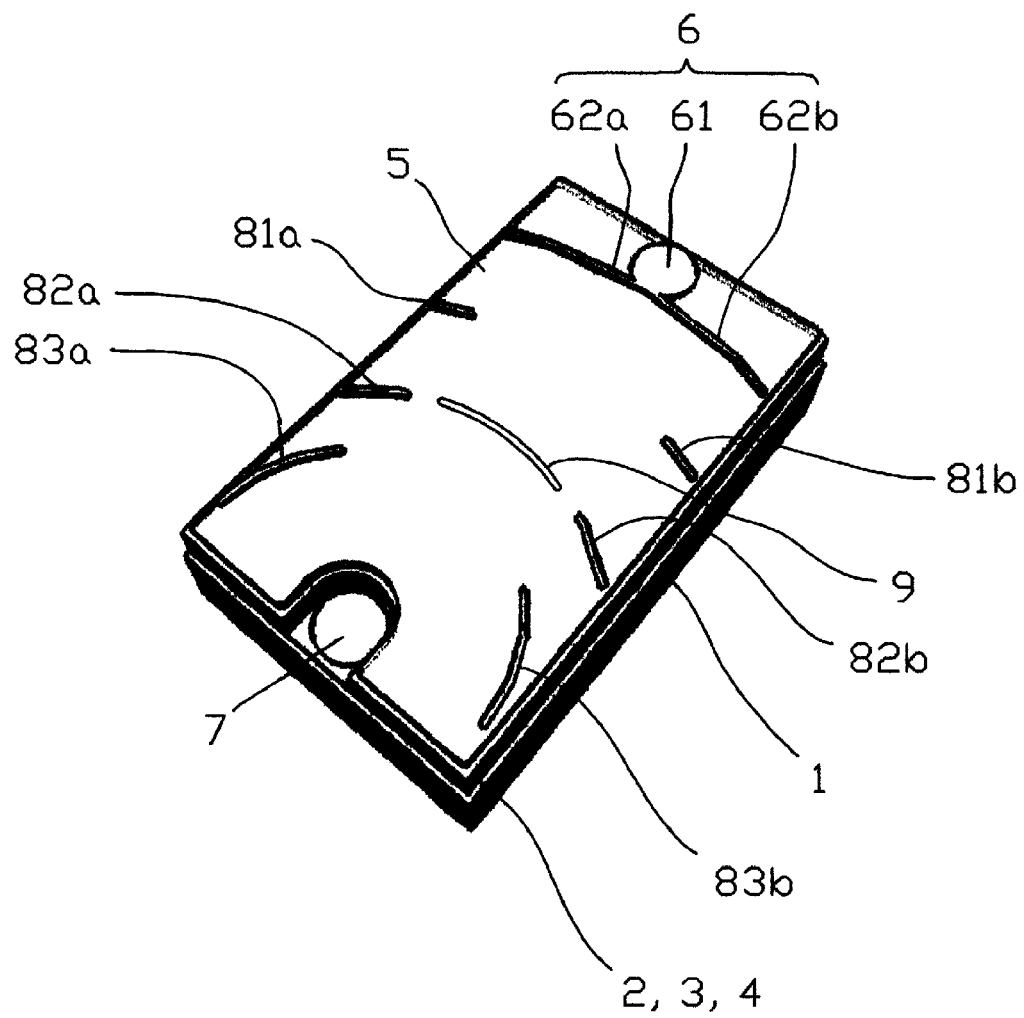
FIG. 16 is a perspective view of a second exemplary embodiment of a face-up optical semiconductor device made in accordance with the principles of the presently disclosed subject matter.
Figure 17A:
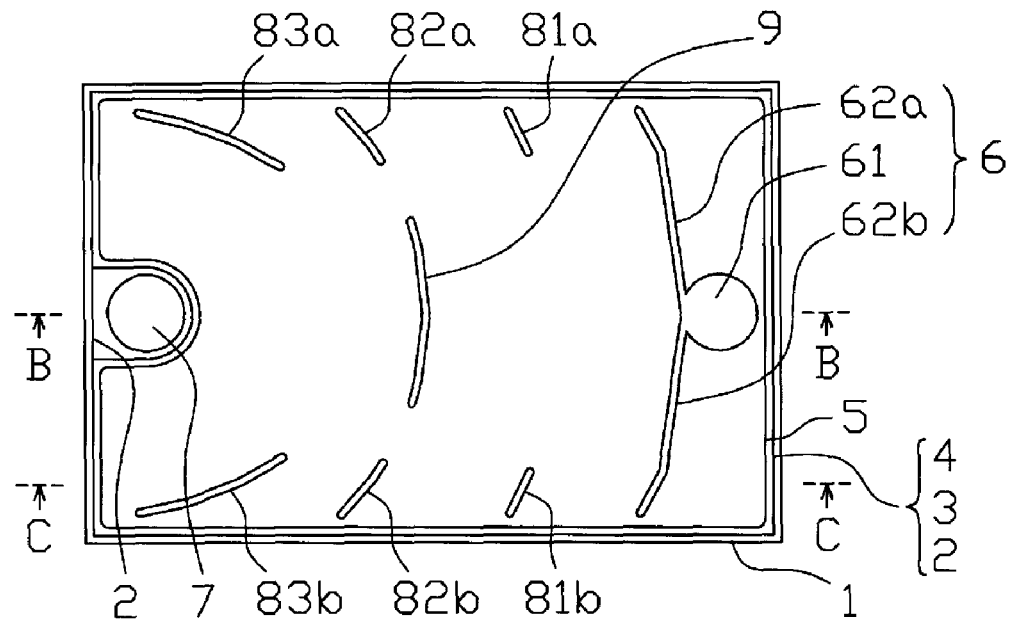
FIGS. 17A, 17B, and 17C are a top view, a cross sectional view taken along the line B-B in FIG. 17A, and a cross sectional view taken along the line C-C in FIG. 17A, respectively, showing the details of the face-up optical semiconductor device of FIG. 16.
Figure 17B:
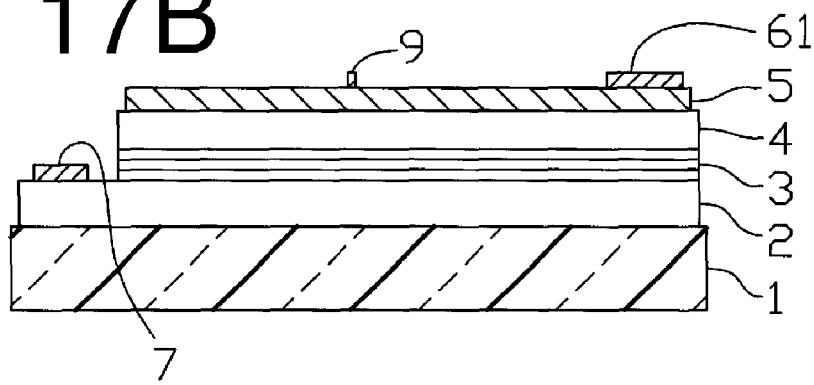
Figure 17C:
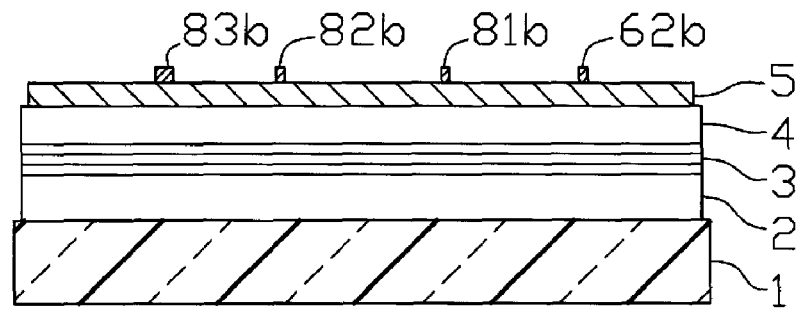

FIG. 16 is a perspective view of a second exemplary embodiment of a face-up optical semiconductor device made in accordance with the principles of the presently disclosed subject matter. FIGS. 17A, 17B, and 17C are a top view, a cross sectional view taken along the line B-B in FIG. 17A, and a cross sectional view taken along the line C-C in FIG. 17A, respectively, showing the details of the face-up optical semiconductor device of FIG. 16.

As shown in FIGS. 16 to 17C, a center independent electrode 9 can be added to the face-up optical semiconductor device as shown in FIGS. 6 to 7C. Specifically, the center independent electrode 9 can be formed on a region of the transparent electrode layer 5 which corresponds to the weak light emission region 202 of FIG. 5 so as to be disposed on a circle having a center located at the n-side electrode 7 or a tangent line of the circle so as to be composed of an arc or linear electrode along the circle or the tangent line. This configuration can reduce the weak light emission region 202. In the illustrated optical semiconductor device, the center independent electrode 9 can be formed to be a single part across the center in the short side direction. However, the presently disclosed subject matter is not limited thereto, and the center independent electrode 9 can be composed of a plurality of center independent electrodes. In this case, in order to even the current distribution, the center independent electrodes may be formed in a line of symmetry with respect to the center of the optical semiconductor device in the short side direction. Further, in FIGS. 17A to 17C, although the center independent electrode 9 is disposed on the same circle as that on which the outside independent electrode 82a and 82b are disposed, the center independent electrode 9 may be disposed on a different circle. Further, the center independent electrode 9 can be physically connected to the outside independent electrodes 82a and 82b when formed on the same circle with the electrodes 82a and 82b.

The center independent electrode 9 can be formed of the same material as that of the p-side electrode 6, but they can be formed of a material such as a metal having a sheet resistance smaller than that of the transparent electrode layer 5. Accordingly, the center independent electrode 9 can be formed at the same time when the p-side electrode 6 is formed, but they should be physically separated from the p-side electrode 6.

Figure 18:
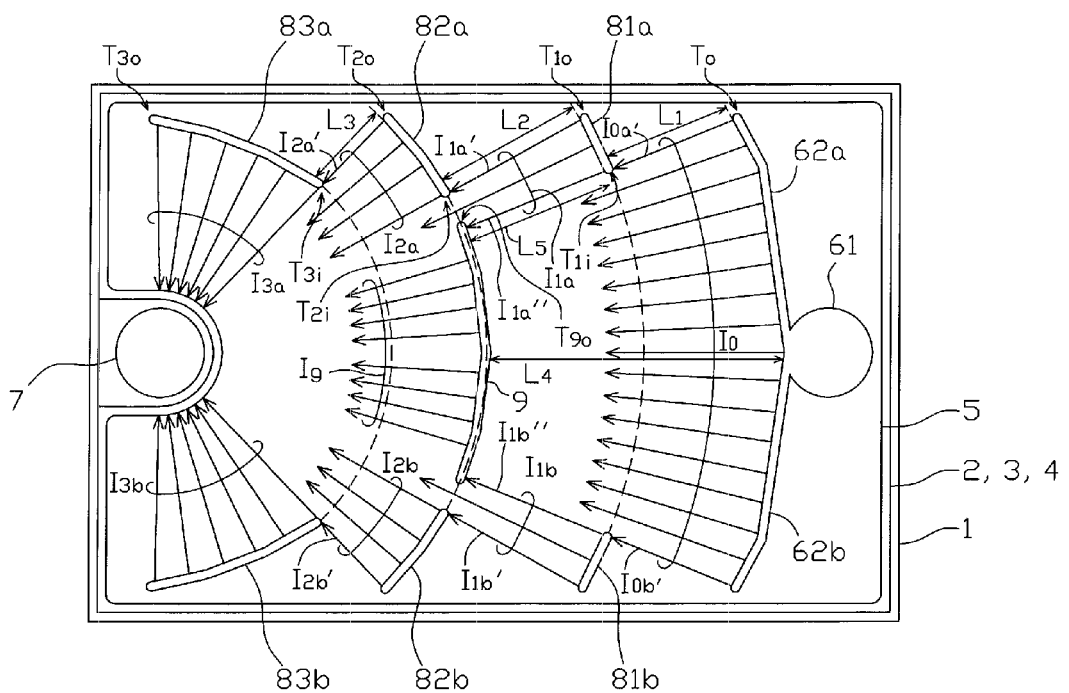
FIG. 18 is an enlarged view of FIG. 17A, illustrating the light emission region in FIG. 16.

The center independent electrode 9 can diffuse part of the current, for example, from the outside independent electrodes 81a and 81b within the transparent electrode layer 5 toward the n-side electrode 7, within the transparent electrode layer 5 at the short side center of the optical semiconductor device, thereby reducing or eliminating the weak light emission region 202 as shown in FIG. 5. This action will be described with reference to FIG. 18 being an enlarged view of FIG. 17A, illustrating the light emission region in FIG. 16. In FIG. 18, the solid line arrows show the current flowing through the transparent electrode layer 5 within the current diffusion distance D, meaning that the regions covered by the solid arrows substantially represent the light emission regions.

Namely, the current $I_0$ flowing from the auxiliary electrode portions 62a and 62b of the p-side electrode 6 toward the n-side electrode 7 within the transparent electrode layer 5 is allowed to be diffused sufficiently so that the center independent electrode 9 cannot receive the current $I_0$. In this case, the distance $L_4$ between the auxiliary electrode portion 62a (62b) and the center independent electrode 9 can be set larger than the current diffusion distance D (=170 μm). In another exemplary embodiment, the distance $L_4$ can be set larger than the minimum value distance Dm. Namely, the relationship therebetween can be set to satisfy $L_4$>D or $L_4$>Dm. On the other hand, the center independent electrode 9 can receive parts $I_{1a}''$ and $I_{1b}''$ of the current $I_{1a}$ and $I_{1b}$ flowing from the outside independent electrodes 81a and 81b toward the n-side electrode 7 within the transparent electrode layer 5, respectively, and can diffuse the same into the transparent electrode layer 5 at the short side center of the optical semiconductor device as current $I_9$. In this case, in order for the center independent electrode 9 to reliably receive currents from the outside independent electrodes 81a and 81b via the transparent electrode layer 5, the radial distance $L_5$ between the outside independent electrode 81a (81b) and the center independent electrode 9 can be set smaller than the minimum value distance Dm. In another embodiment, the radial distance $L_5$ can be set smaller than the current diffusion distance D (=170 μm). Namely, the relationship therebetween can be set to satisfy $L_5$<Dm or $L_5$<D. For example, $L_5$ can be set to 100 μm. At the same time, the outside end portion $T_{9o}$ of the center independent electrode 9 can be disposed on, or outer than, the intersection between the line connecting the inside end portion $T_{1i}$ of the outside independent electrode 81a (81b) nearer the p-side electrode 6 than the center independent electrode 9 and the center of the n-side electrode 7 and the circle along which the center independent electrode 9 is formed. In the present exemplary embodiment, the outside end portion $T_{9o}$ of the center independent electrode 9 can be within 5 μm from the intersection toward the outside on the circle. It should be noted that the center independent electrode 9 can have a shorter length in view of the light extraction efficiency. In order to achieve the divided current flow ratio of $I_{1a}''/I_{1a}$ and $I_{1b}''/I_{1b}$, it can be advantageous to dispose the outside end portion $T_{9o}$ of the center independent electrode 9 on the intersection.

Note that in FIG. 18, the current flows from the center independent electrode 9 toward the n-side electrode 7 are shown straightforwardly, but actually they can diffuse in the plane direction of the transparent electrode layer 5 slightly. Accordingly, although the outside end portion of the center independent electrode 9 can be positioned on the intersection as described above, it can be shifted slightly.

As described above, it can be advantageous to set the radial distances $L_4$ between the auxiliary electrode portions 62a and 62b of the p-side electrode 6 and the center independent electrode 9 larger than the current diffusion distance D. In another embodiment, the radial distances $L_4$ can be set larger than the minimum value distance Dm. At the same time, it can be advantageous to set the radial distances $L_5$ between the outside independent electrodes 81a and 81b and the center independent electrode 9 smaller than the minimum value distance Dm. In another embodiment, the radial distances $L_5$ can be set smaller than the current diffusion distance D. For example, they can be set to 15 to 90% of the current diffusion distance D. In another embodiment, they can be set to 20 to 80% thereof. This configuration can decrease the center weak light emission region of the optical semiconductor device.

Figure 19:
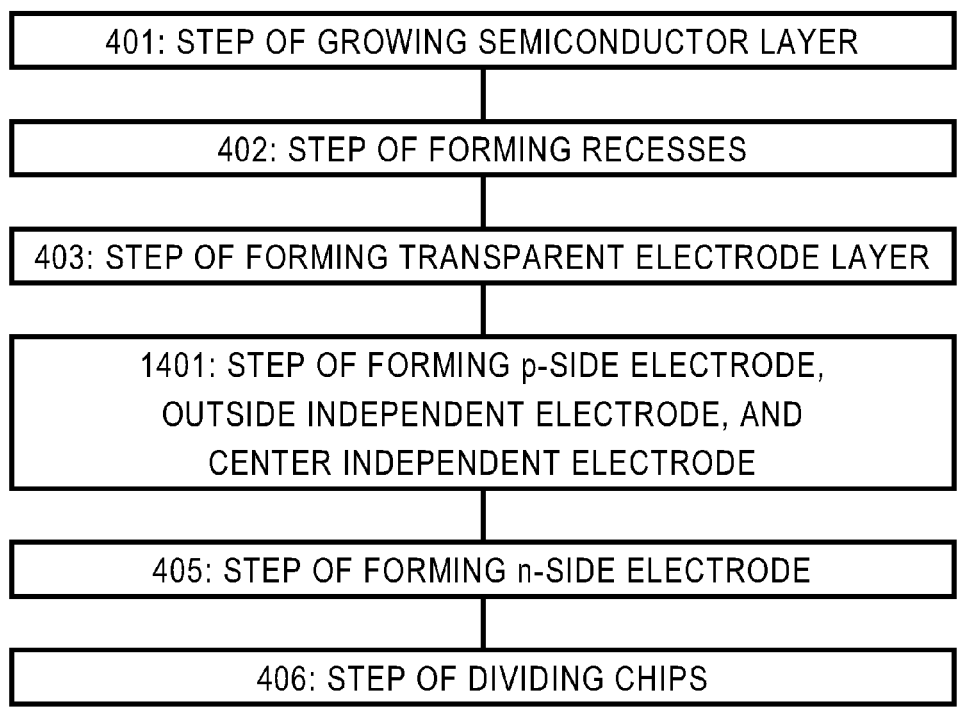
FIG. 19 is a flow chart describing a method for manufacturing the face-up optical semiconductor device of FIGS. 16 to 17C.

Next, with reference to FIG. 19 being a flow chart a method for manufacturing the face-up optical semiconductor device of FIGS. 16 to 17C will be described.

As shown in the flow chart, instead of Step 404 of forming a p-side electrode and outside independent electrodes as shown in FIG. 9, included can be Step 1401 of forming a p-side electrode, outside independent electrodes, and a center independent electrode. Namely, in Step 1401, a lift-off method can be carried out to simultaneously form the p-side electrode 6 including the pad portion 61 and the auxiliary electrode portions 62a and 62b, the outside independent electrodes 81a, 81b, 82a, 82b, 83a, and 83b, and the center independent electrode 9.

If the p-side electrode 6' including the pad portion 61' and the auxiliary electrode portions 62a' and 62b', the outside independent electrodes 81a', 81b', 82a', 82b', 83a', and 83b' are formed underneath the transparent electrode layer 5 as shown in FIGS. 10A to 11C, the center independent electrode 9 can also be formed underneath the transparent electrode layer 5.

Further, if the p-side electrode 6 including the pad portion 61 and the auxiliary electrode portions 62a and 62b is formed on the transparent electrode layer 5 while the outside independent electrodes 81a', 81b', 82a', 82b', 83a', and 83b' are formed underneath the transparent electrode layer 5 as shown in FIGS. 13 to 14C, the center independent electrode 9 can also be formed underneath the transparent electrode layer 5.

Still further, if part of the outside independent electrodes is formed on the transparent electrode layer 5 while the remaining part thereof is formed underneath the transparent electrode layer 5, the center independent electrode 9 can be formed on or underneath the transparent electrode layer 5. If the center independent electrode 9 is formed on the transparent electrode layer 5, the outside independent electrodes and the auxiliary electrode nearer the p-side electrode 6 than the center independent electrode 9 should be formed on the transparent electrode layer 5. If the center independent electrode 9 is formed underneath the transparent electrode layer 5, the outside independent electrodes nearer the n-side electrode 7 than the center independent electrode 9 should be formed underneath the transparent electrode layer 5.

Figure 20:
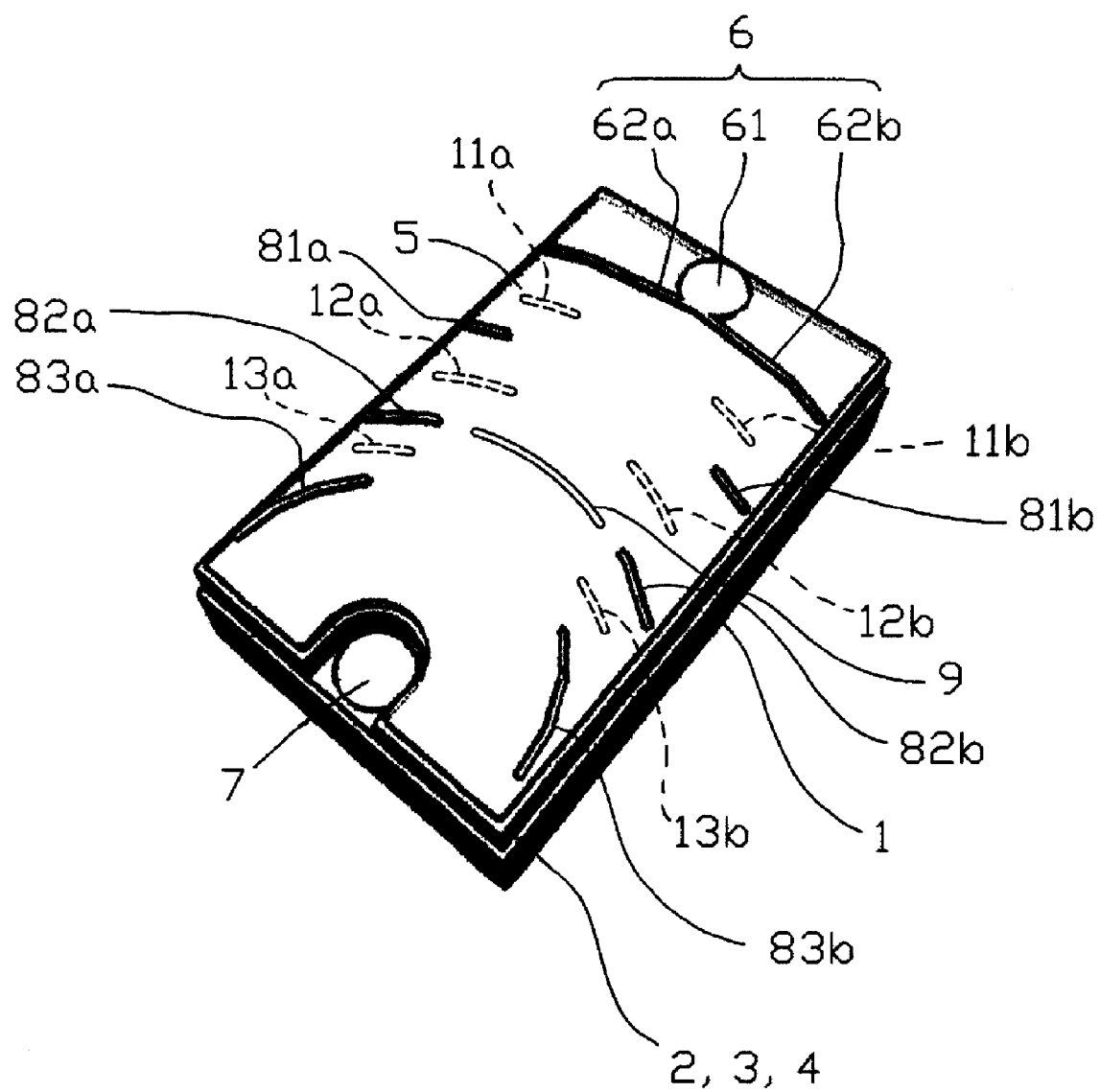
FIG. 20 is a perspective view of a third exemplary embodiment of a face-up optical semiconductor device made in accordance with the principles of the presently disclosed subject matter.
Figure 21A:
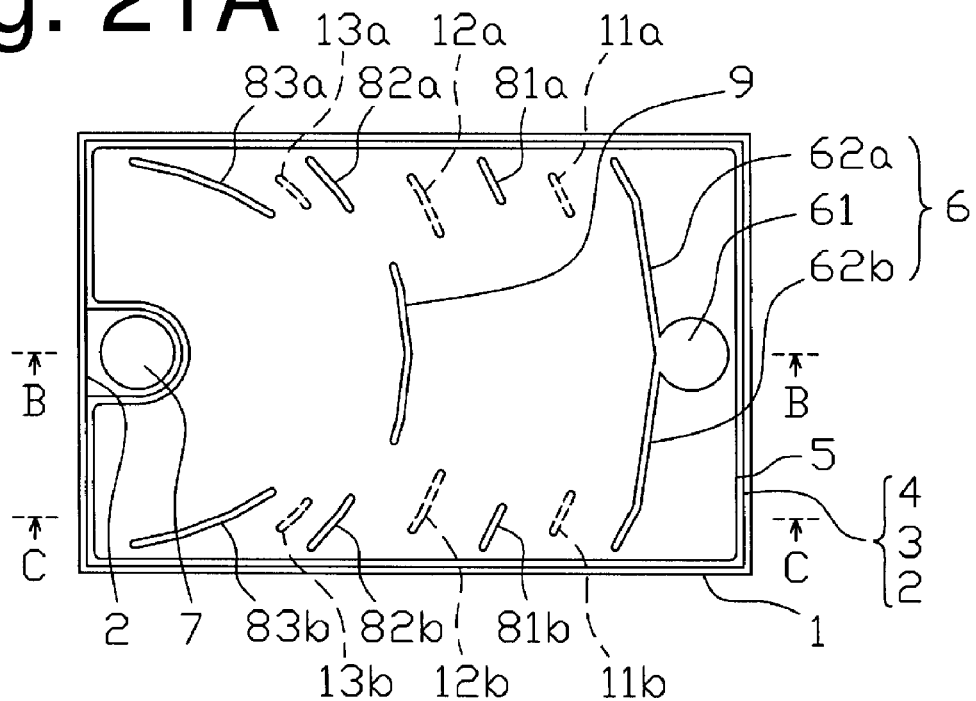
FIGS. 21A, 21B, and 21C are a top view, a cross sectional view taken along the line B-B in FIG. 21A, and a cross sectional view taken along the line C-C in FIG. 21A, respectively, showing the details of the face-up optical semiconductor device of FIG. 20.
Figure 21B:
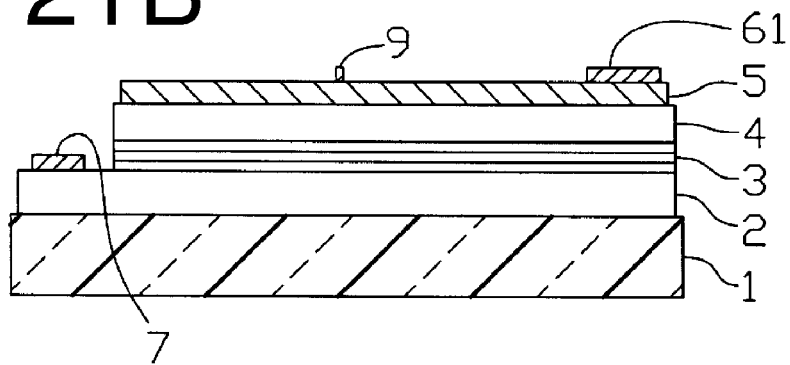
Figure 21C:
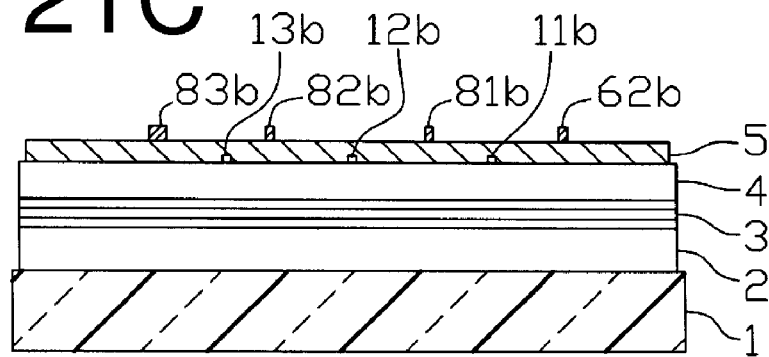

FIG. 20 is a perspective view of a third exemplary embodiment of a face-up optical semiconductor device made in accordance with the principles of the presently disclosed subject matter. FIGS. 21A, 21B, and 21C are a top view, a cross sectional view taken along the line B-B in FIG. 21A, and a cross sectional view taken along the line C-C in FIG. 21A, respectively, showing the details of the face-up optical semiconductor device of FIG. 20.

As shown in FIGS. 20 and 21A to 21C, transparent insulation layers 11a and 11b can be added to the face-up optical semiconductor device as shown in FIGS. 6 to 7C between the auxiliary electrode portion 62a and the outside independent electrode 81a and between 62b and 81b. In addition, transparent insulation layers 12a and 12b can be added between the outside independent electrode 81a and the outside independent electrode 82a and between 81b and 82b. Still further, transparent insulation layers 13a and 13b can be added between the outside independent electrode 81a and the outside independent electrode 82a and between 81b and 82b. In this case, the transparent insulation layers 11a, 11b, 12a, 12b, 13a, and 13b can be disposed on a concentric circle having a center located at the n-side electrode 7 or a tangent line of the circle so as to be composed of an arc or linear electrode along the circle or the tangent line. This configuration can decrease the area covered by the outside independent electrodes 81a, 81b, 82a, 82b, 83a, and 83b and the center independent electrode 9, thereby increasing the effective light emission region.

Note that the transparent insulation layers can be provided on two or more concentric circles having different radius between the auxiliary electrode portions and the outside independent electrode or between the outside independent electrode and the center independent electrode, and the outside independent electrode.

The transparent insulation layers 11a, 11b, 12a, 12b, 13a, and 13b can be formed from silicon oxide ($SiO_2$), for example. Furthermore, the transparent insulation layers 11a, 11b, 12a, 12b, 13a, and 13b can be thinner than the transparent electrode layer 5 and formed within the transparent electrode layer 5. Advantageously, as shown in FIG. 21C, the transparent insulation layers 11a, 11b, 12a, 12b, 13a, and 13b can be formed on the semiconductor layer (2, 3, 4). Accordingly, the thickness of the transparent electrode layer 5 at the regions immediately above the transparent insulation layers 11a, 11b, 12a, 12b, 13a, and 13b can be decreased whereas the sheet resistance thereof can be inversely increased. As a result, current diffusion around the transparent insulation layers 11a, 11b, 12a, 12b, 13a, and 13b can be facilitated in the circumferential direction of the concentric circles. In this case, the current can also pass through the regions immediately above the transparent insulation layers 11a, 11b, 12a, 12b, 13a, and 13b can be while being diffused. Accordingly, the weak light emission regions can be decreased.

In the above configuration, although the transparent insulation layers are formed on the p-type GaN layer 4, the transparent insulation layers can be formed at regions other than that on the p-type GaN layer 4 as long as they are present within the transparent electrode layer 5.

Figure 22A:
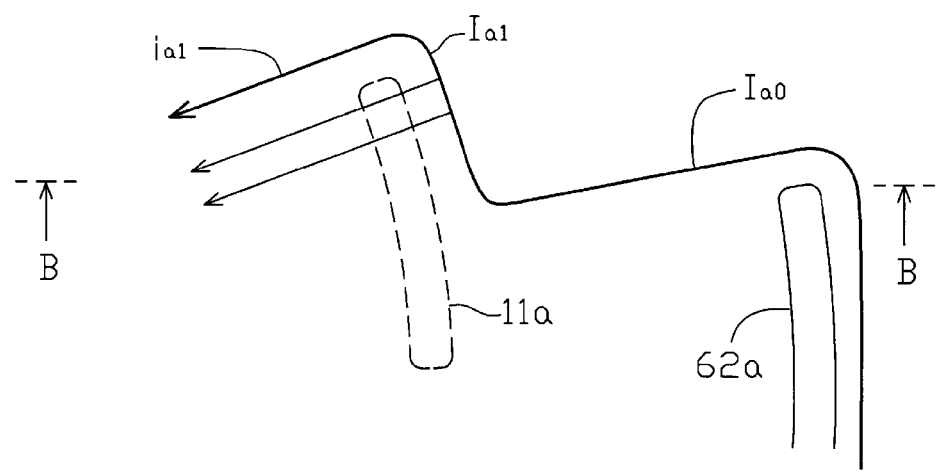
FIGS. 22A and 22B are a partial top view and a partial cross sectional view, respectively, illustrating the current diffusion in the transparent electrode layer 5 by the transparent insulation layer as shown in FIGS. 20 to 21C.
Figure 22B:
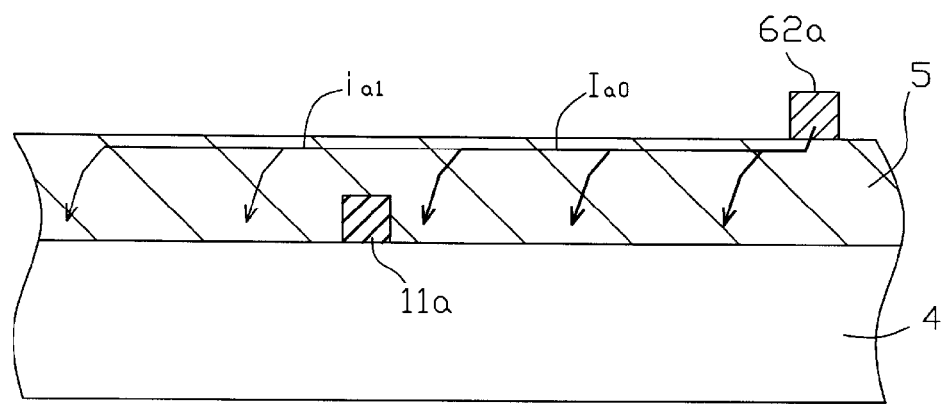

FIGS. 22A and 22B are a partial top view and a partial cross sectional view, respectively, illustrating the current diffusion in the transparent electrode layer 5 by the transparent insulation layer 11a as shown in FIGS. 20 to 21C.

As shown in FIG. 22A, as the sheet resistance of the transparent electrode layer 5 immediately above the transparent insulation layer 11a is large, the current $I_{a0}$ from the auxiliary electrode portion 62a toward the transparent insulation layer 11a through the transparent electrode layer 5 can flow along the transparent insulation layer 11a, which is located in a direction with a lower sheet resistance, thereby being diffused in the circumferential direction around the n-side electrode 7 outward as current $I_{a1}$. At the same time, as shown in FIGS. 22A and 22B, current $i_{a1}$ can flow at the region where the sheet resistance of the transparent electrode layer 5 is high immediately above the transparent insulation layer 11a. Accordingly, the transparent insulation layer 11a can diffuse the current $I_{a0}$ within the transparent electrode layer 5 outward without shielding the light from the semiconductor layer (2, 3, 4) as current $I_{a1}$ and $i_{a1}$.

Figure 23:
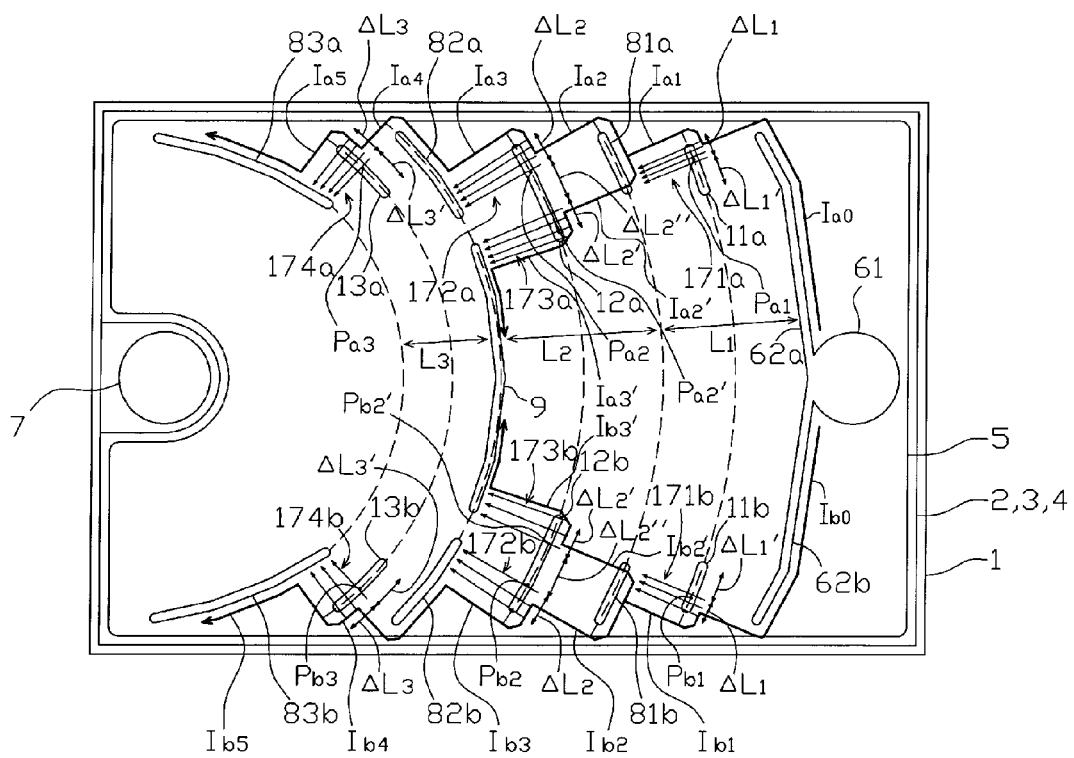
FIG. 23 is an enlarged view of FIG. 21A, illustrating the light emission region in FIG. 20.

FIG. 23 is an enlarged view of FIG. 21A, illustrating the light emission region in FIG. 20.

With reference to the drawing, current flowing from the auxiliary electrode portion 62a (62b) through the transparent electrode layer 5 to the outside independent electrode 81a (81b), 82a (82b) and 83a (83b), and the center independent electrode 9 is considered, which is other than the currents $I_0$, $I_{1a}$, $I_{1b}$, $I_{2a}$, $I_{2b}$, $I_{3a}$, and $I_{3b}$ as shown in FIG. 18.

As shown, the transparent insulation layer 11a (11b) can be formed to include an intersection $P_{a1}$ ($P_{b1}$) between the circle with a center located at the n-side electrode 7 and on which the transparent insulation layer 11a (11b) is formed, and the line connecting the outside end portion of the auxiliary electrode portion 62a (62b) and the center of the n-side electrode 7. If the transparent insulation layer 11a (11b) deviates from the intersection $P_{a1}$ ($P_{b1}$), the current $I_{a0}$ ($I_{b0}$) from the auxiliary electrode portion 62a (62b) can pass the region above the intersection, whereby the current $I_{a0}$ ($I_{b0}$) might not be diffused outward. Further, if the distance between the intersection $P_{a1}$ ($P_{b1}$) and the outside end portion of the transparent insulation layer 11a (11b) is $\Delta L_1$, it can be advantageous to satisfy either of the following expressions:

$$L_1 + \Delta L_1 < Dm \text{ or } L_1 + \Delta L_1 < D.$$

Here, $L_1$ is the radial distance between the auxiliary electrode portion 62a (62b) and the outside independent electrode 81a (81b). Note that if $L_1 + \Delta L_1 \geqq Dm$ or $D$, the diffused current $I_{a1}$ ($I_{b1}$) that is caused by allowing the current $I_{a0}$ ($I_{b0}$) to flow from the auxiliary electrode portion 62a (62b) outward cannot reach the outside independent electrode 81a (81b). Furthermore, if the distance between the intersection $P_{a1}$ ($P_{b1}$) and the inside end portion of the transparent insulation layer 11a (11b) is $\Delta L_1'$, it can be advantageous to satisfy the following expression:

$$\Delta L_1 \leqq \Delta L_1'.$$

If $\Delta L_1 > \Delta L_1'$, the current $I_{a0}$ ($I_{b0}$) from the auxiliary electrode portion 62a (62b) can be diffused toward the center rather than toward the end portions of the optical semiconductor device, thereby decreasing the expansion of the effective light emission regions.

Accordingly, the current $I_{a0}$ ($I_{b0}$) from the auxiliary electrode portion 62a (62b) toward the outside independent electrode 81a (81b) can be diffused outward as the current $I_{a1}$ ($I_{b1}$), and at the same time the current $I_{a0}$ ($I_{b0}$) can be diffused from the region immediately above the transparent insulation layer 11a (11b) toward the outside independent electrode 81a (81b). As a result, the region between the transparent insulation layer 11a (11b) and the outside independent electrode 81a (81b) can serve as an effective light emission region 171a (171b).

Further, the inside end portion of the outside independent electrode 81a (81b) can be configured such that the center of the n-side electrode 7, the inside end portion of the outside independent electrode 81a (81b), and the outside end portion of the transparent insulation layer 11a (11b) are aligned on a straight line. For example, the inside end portion 81a' (81b') of the outside independent electrode 81a (81b) can be shortened to minimize the covering area of the outside independent electrode 81a (81b) while the effective light emission regions can be increased. Note that, if the current diffusion is the first priority, it might not be necessary to shorten the outside independent electrode 81a (81b) so that the inside end portion 81a' (81b') can be remained.

The transparent insulation layer 12a (12b) can be formed to include the intersection $P_{a2}$ ($P_{b2}$) between the circle having a center located at the n-side electrode 7 where the transparent insulation layer 12a (12b) is formed and the line connecting the outside end portion of the outside independent electrode 81a (81b) and the center of the n-side electrode 7. Furthermore, the transparent insulation layer 12a (12b) can be formed to include the intersection $P_{a2}'$ ($P_{b2}'$) between the above-described circle and the line connecting the inside end portion of the outside independent electrode 81a (81b) (or the outside end portion of the center independent electrode 9) and the center of the n-side electrode 7. If the transparent insulation layer 12a (12b deviates from the intersection $P_{a2}$ ($P_{b2}$) or $P_{a2}'$($P_{b2}'$), the current $I_{a2}$ ($I_{b2}$) and $I_{a2}'$ ($I_{b2}'$) from the outside independent electrode 81a (81b) can pass through the region above the intersection, whereby the current $I_{a2}$ ($I_{b2}$) or $I_{a2}'$ ($I_{b2}'$) might not be diffused outward or inward. Further, if the distance between the intersection $P_{a2}$ ($P_{b2}$) and the outside end portion of the transparent insulation layer 12a (12b) is $\Delta L_2$, it can be advantageous to satisfy either of the following expressions:

$$L_2+\Delta L_2<Dm \text{ or } L_2+\Delta L_2<D.$$

Here, $L_2$ is the distance between the outside independent electrode 81a (81b) and the outside independent electrode 82a (82b). Note that if $L_2+\Delta L_2 \geq Dm$ or $D$, the diffused current $I_{a3}$ ($I_{b3}$) that is caused by allowing the current $I_{a2}$ ($I_{b2}$) to flow from the outside independent electrode 81a (81b) outward might not reach the outside independent electrode 82a (82b). Furthermore, if the distance between the intersection $P_{a2}'$ ($P_{b2}'$) and the inside end portion of the transparent insulation layer 12a (12b) is $\Delta L_2'$, it can be advantageous to satisfy either of the following expressions:

$$L_2+\Delta L_2'<Dm \text{ or } L_2+\Delta L_2'<D.$$

Furthermore, if the distance between the intersection $P_{a2}$ ($P_{b2}$) and the intersection $P_{a2}'$ ($P_{b2}'$) is $\Delta L_2''$, it can be advantageous to satisfy the following expressions:

$$\Delta L_2 \leq \Delta L_2''+\Delta L_2', \text{ and}$$

$$\Delta L_2' \leq \Delta L_2''+\Delta L_2.$$

Note that if $\Delta L_2 > \Delta L_2''+\Delta L_2'$, almost all the current $I_{a2}$ ($I_{b2}$) that flows from the outside independent electrode 81a (81b) and is diffused to the central portion rather than to the end portions of the optical semiconductor device might not reach the outside independent electrode 82a (82b). Note that if $\Delta L_2' > \Delta L_2''+\Delta L_2$, almost all the current $I_{a2}'$ ($I_{b2}'$) that flows from the outside independent electrode 81a (81b) and is diffused to the outside rather than to the center independent electrode 9 might not sufficiently reach the center independent electrode 9, thereby decreasing the expansion of the effective light emission region.

As described above, the current $I_{a2}$ ($I_{b2}$) from the outside independent electrode 81a (81b) toward the outside independent electrode 82a (82b) can be diffused to the outside of the optical semiconductor device as current $I_{a3}$ ($I_{b3}$), and at the same time, diffused from the regions immediately above the transparent insulation layer 12a (12b) to the outside independent electrode 82a (82b). As a result, the region between the transparent insulation layer 12a (12b) and the outside independent electrode 82a (82b) can serve as an effective light emission region 172a (172b).

Furthermore, the current $I_{a2}'$ ($I_{b2}'$) from the outside independent electrode 81a (81b) toward the outside independent electrode 82a (82b) can be diffused to the inside of the center independent electrode 9 as current $I_{a3}'$ ($I_{b3}'$), and at the same time, diffused from the regions immediately above the transparent insulation layer 12a (12b) to the outside independent electrode 82a (82b). As a result, the region between the transparent insulation layer 12a (12b) and the center independent electrode 9 can serve as an effective light emission region 173a (173b).

Further, the inside end portion of the outside independent electrode 82a (82b) can be configured such that the center of the n-side electrode 7, the inside end portion of the outside independent electrode 82a (82b), and the outside end portion of the transparent insulation layer 12a (12b) are aligned on a straight line. For example, the inside end portion 82a' (82b') of the outside independent electrode 82a (82b) can be shortened to minimize the covering area of the outside independent electrode 82a (82b) while the effective light emission regions increase. Note that, if the current diffusion is the first priority, it might not be necessary to shorten the outside independent electrode 82a (82b) so that the inside end portion 82a' (82b') can remain unmodified.

Further, the outside end portion of the center independent electrode 9 can be configured such that the center of the n-side electrode 7, the outside end portion of the center independent electrode 9, and the outside end portion of the transparent insulation layer 12a (12b) are aligned on a straight line. By doing so, the outside end portion 9a of the center independent electrode 9 can be shortened to minimize the covering area of the center independent electrode 9, so that the effective light emission regions can be increased. Note that, if the current diffusion is the first priority, it might not be necessary to shorten the center independent electrode 9 so that the outside end portion 9a can remain unmodified.

The transparent insulation layer 13a (13b) can be formed to include the intersection $P_{a3}$ ($P_{b3}$) between the circle having a center located at the n-side electrode 7 where the transparent insulation layer 13a (13b) is formed and the line connecting the outside end portion of the outside independent electrode 82a (82b) and the center of the n-side electrode 7. If the transparent insulation layer 13a (13b) deviates from the intersection $P_{a3}$ ($P_{b3}$), the current $I_{a4}$ ($I_{b4}$) 4 from the outside independent electrode 82a (82b) can pass through the region above the intersection, whereby the current $I_{a4}$ ($I_{b4}$) might not be diffused outward. Further, if the distance between the intersection $P_{a4}$ ($P_{b4}$) and the outside end portion of the transparent insulation layer 13a (13b) is $\Delta L_3$, it can be advantageous to satisfy either of the following expressions:

$$L_3+\Delta L_3<Dm \text{ or } L_3+\Delta L_3<D.$$

Here, $L_3$ is the distance between the outside independent electrode 82a (82b) and the outside independent electrode 83a (83b). Note that if $L_3+\Delta L_3 \geq D$, the diffused current $I_{a5}$ ($I_{b5}$) that is caused by allowing the current $I_{a4}$ ($I_{b4}$) to flow from the outside independent electrode 82a (82b) outward might not reach the outside independent electrode 83a (83b). Furthermore, if the distance between the intersection $P_{a3}$ ($P_{b3}$) and the inside end portion of the transparent insulation layer 13a (13b) is $\Delta L_3'$, it can be advantageous to satisfy the following expression:

$$\Delta L_3 \leq \Delta L_3.$$

Note that if $\Delta L_3 > \Delta L_3$, the current $I_{a4}$ ($I_{b4}$) can flow from the outside independent electrode 82a (82b) and can be diffused to the center portion rather than to the end portions of the optical semiconductor device, thereby decreasing the expansion of the effective light emission region.

As described above, the current $I_{a4}$ ($I_{b4}$) from the outside independent electrode 82a (82b) toward the outside independent electrode 83a (83b) can be diffused to the outside of the optical semiconductor device as current $I_{a5}$ ($I_{b5}$), and at the same time, diffused from the regions immediately above the transparent insulation layer 13a (13b) to the outside independent electrode 83a (83b). As a result, the region between the transparent insulation layer 13a (13b) and the outside independent electrode 83a (83b) can serve as an effective light emission region 174a (174b).

Further, the inside end portion of the outside independent electrode 83a (83b) can be configured such that the center of the n-side electrode 7, the inside end portion of the outside independent electrode 83a (83b), and the outside end portion of the transparent insulation layer 13a (13b) are aligned on a straight line. For example, the inside end portion 83a' (83b') of the outside independent electrode 83a (83b) can be shortened to minimize the covering area of the outside independent electrode 83a (83b) while the effective light emission regions increase. Note that, if the current diffusion is the first priority, it might not be necessary to shorten the outside independent electrode 83a (83b) so that the inside end portion 83a' (83b') can remain unmodified.

In FIG. 23, the distances $\Delta L_1$ and $\Delta L_1'$ of the transparent insulation layer 11a (11b) can be approximately 10 μm and approximately 20 μm. respectively. Further, the distances $\Delta L_2$, $\Delta L_2'$ and $\Delta L_2''$ of the transparent insulation layer 12a (12b) can be approximately 20 μm, approximately 20 μm, and approximately 60 μm. respectively. Still further, the distances $\Delta L_3$ and $\Delta L_3'$ of the transparent insulation layer 13a (13b) can be approximately 10 μm and approximately 20 μm. respectively. In this case, if $L_1$=100 μm, $L_2$=100 μm, $L_3$=65 μm, and D=150 μm, then $L_1+\Delta L_1$=110<Dm or D, $L_2+\Delta L_2$ ($\Delta L_2'$)=120<Dm or D, and $L_3+\Delta L_3$=110<Dm or D. This configuration can allow the current to reach the outside independent electrode 83a (83b) and the center independent electrode 9.

Figure 24:
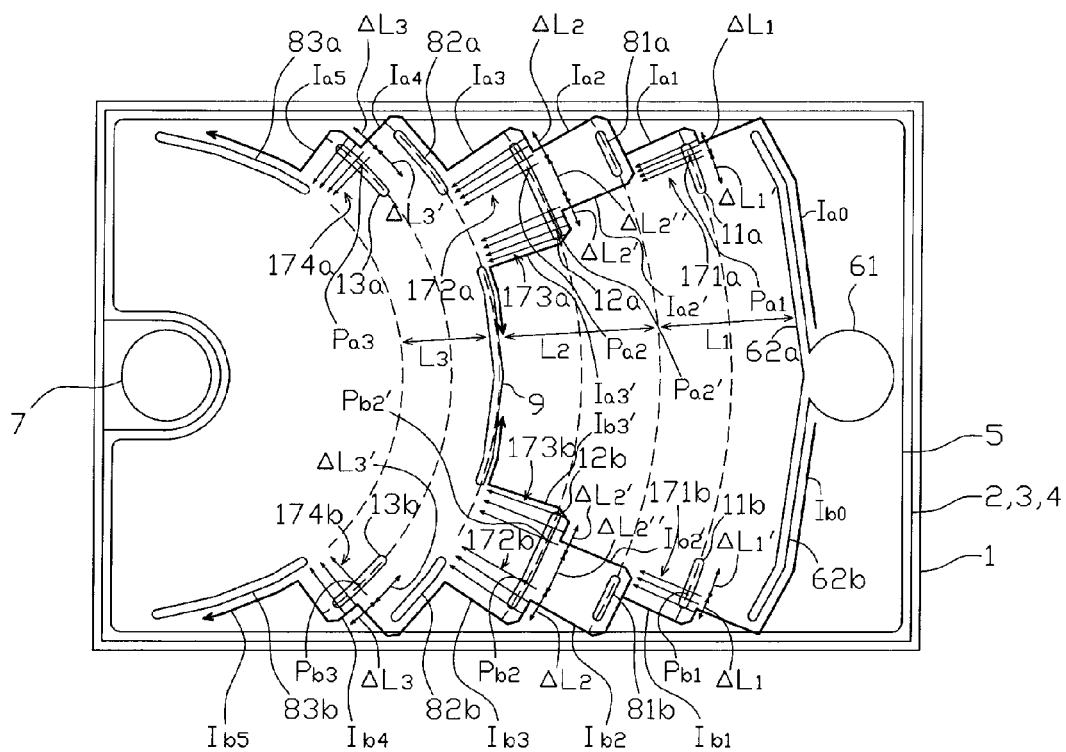
FIG. 24 is a top view showing a modification of the face-up optical semiconductor device of FIG. 23.

FIG. 24 is a top view showing a modification of the face-up optical semiconductor device of FIG. 23. As shown in FIG. 24, part of the outside independent electrodes 81a, 81b, 82a, 82b, 83a, and 83b and part of the center independent electrode 9 can be omitted. This can decrease the covered area of the transparent electrode layer 5, thereby increasing the effective light emission regions.

In FIG. 23, the total of the increased effective light emission regions 171a, 171b, 172a, 172b, 173a, 173b, 174a, and 174b corresponds to approximately 2% of the area of the transparent electrode layer 5, which corresponds to approximately 20% of the weak light emission regions as shown in FIG. 18. On the other hand, in FIG. 24, the total of the shortened inside end portions of the outside independent electrodes 81a, 81b, 82a, 82b, 83a, and 83b and the shortened outside end portions of the center independent electrode 9 corresponds to approximately 0.3% of the area of the transparent electrode layer 5, which corresponds to approximately 5% of the total area of the p-side electrode 6 (61a, 62a, m 62b), the outside independent electrodes 81a, 81b, 82a, 82b, 83a, and 83b, and the center independent electrode 9. As a result, since the electrode covering area can be decreased by this amount, the effective light extraction area can be increased. In conclusion, when compared to the case of the second exemplary embodiment, the present exemplary embodiment can increase the effective light emission regions by approximately 2% and the effective light extraction area by approximately 0.3%.

When the transparent insulation layers 11a, 11b, 12a, 12b, 13a, and 13b are introduced into the device, part of the active layer 3 located immediately below the transparent insulation layers might not emit light, thereby resulting in decrease of light emission area. Furthermore, the introduction can decrease the contact area between the transparent electrode layer 5 and the semiconductor layer (2, 3, 4), thereby resulting in increase of a forward voltage ($V_f$) or the like. However, the current can diffuse within the semiconductor layer (2, 3, 4) in a plane direction of the optical semiconductor device to some extent, and the total area of the transparent insulation layers 11a, 11b, 12a, 12b, 13a, and 13b is only approximately 0.9% of the area of the transparent electrode layer 5. Accordingly, substantial decrease in the light emission area and increase in the forward voltage may not be observed.

Figure 25:
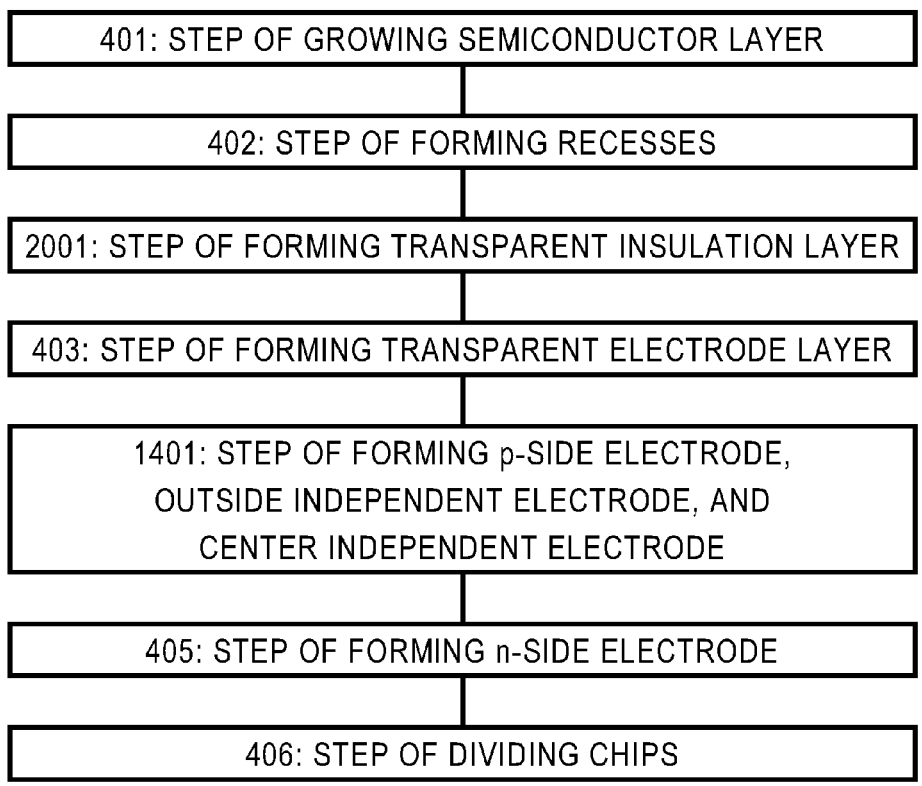
FIG. 25 is a flow chart describing a method for manufacturing the face-up optical semiconductor device of FIGS. 20 to 21C.

Next with reference to FIG. 25, a method for manufacturing the face-up optical semiconductor device of FIGS. 20 to 21C will be described.

As shown in the flow chart, Step 2001 of forming transparent insulation layers can be carried out prior to Step 403 of forming a transparent electrode layer, thereby forming the transparent insulation layers 11a, 11b, 12a, 12b, 13a, and 13b. For example, a silicon oxide layer can be first formed by CVD method or the like and then patterned by photolithography, etching, and the like.

In the above exemplary embodiment, instead of the current diffusion distance D, 15 to 90% of the current diffusion distance D, and in particular, 20 to 80% of the current diffusion distance D, can be adopted.

As described above, when the face-up optical semiconductor device of FIGS. 20 to 21C is manufactured, the only step of forming transparent insulation layers is added to the manufacturing method of FIGS. 16 to 17C.

In the above exemplary embodiments, three pairs of outside independent electrodes are utilized, but it is not limitative. At least one pair of such outside independent electrodes can be used. Although a single center independent electrode is provided, two or more of center independent electrodes can be used. There can be two preconditions for providing such a center independent electrode. One of the preconditions can be that another center independent electrode or another auxiliary electrode portion should not be provided within the area nearer than the current diffusion distance from the original center independent electrode. If such another center independent electrode or another auxiliary electrode portion is provided within the area nearer than the current diffusion distance, current may flow to the next center independent electrode before it is diffused to the end portions of the auxiliary electrodes, the outside independent electrodes and the center independent electrode, namely, diffused to the short-side outside areas of the optical semiconductor device. Accordingly, the current may concentrate at the center portion of the optical semiconductor device, thereby causing an uneven light emission distribution. The other precondition can be to dispose at least one pair of the outside independent electrodes within the area nearer than the current diffusion distance. If there is no outside independent electrode provided within the area nearer than the current diffusion distance from the center independent electrode, a sufficient amount of current might not be caused to flow to the center independent electrode. In view of this, at least one pair of the outside independent electrodes must or should be provided between the auxiliary electrode portion and the center independent electrode and between the center independent electrodes, if any. Furthermore, in the above exemplary embodiment the transparent insulation layers are provided between the auxiliary electrode portions and the outside independent electrodes, between the adjacent outside independent electrodes, and between the outside independent electrodes and the center independent electrode. However, this is not limitative, and at least one transparent insulation layer can be formed.

Figure 26:
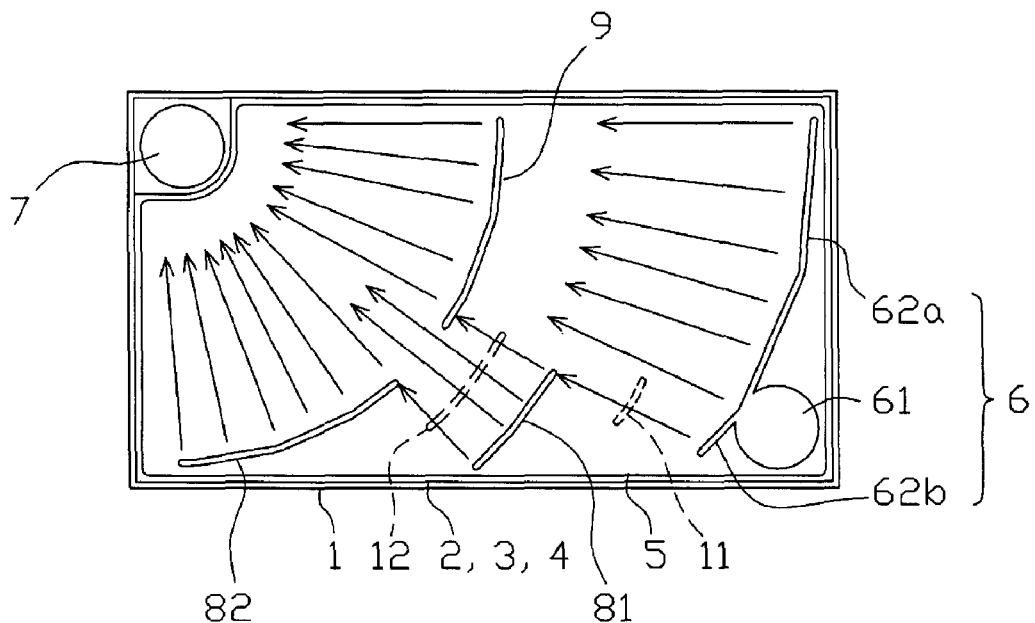
FIG. 26 is a top view showing another exemplary embodiment of a face-up optical semiconductor device made in accordance with the principles of the presently disclosed subject matter.

In the above exemplary embodiments, the p-side electrode 6 and the n-side electrode 7 are disposed on the center area in the short side direction. However, this is not limitative. As shown in FIG. 26, they can be disposed at diagonally opposed corners of the optical semiconductor device. In this case, the outside independent electrodes 81 and 82 can be disposed on one side while the center independent electrode can be disposed on the other side. The transparent insulation layers 11 and 12 can be disposed between the auxiliary electrode portion 62b and the outside independent electrode 81 and between the outside independent electrode 81, and the outside independent electrode 82 and the center independent electrode 9.

Figure 27:
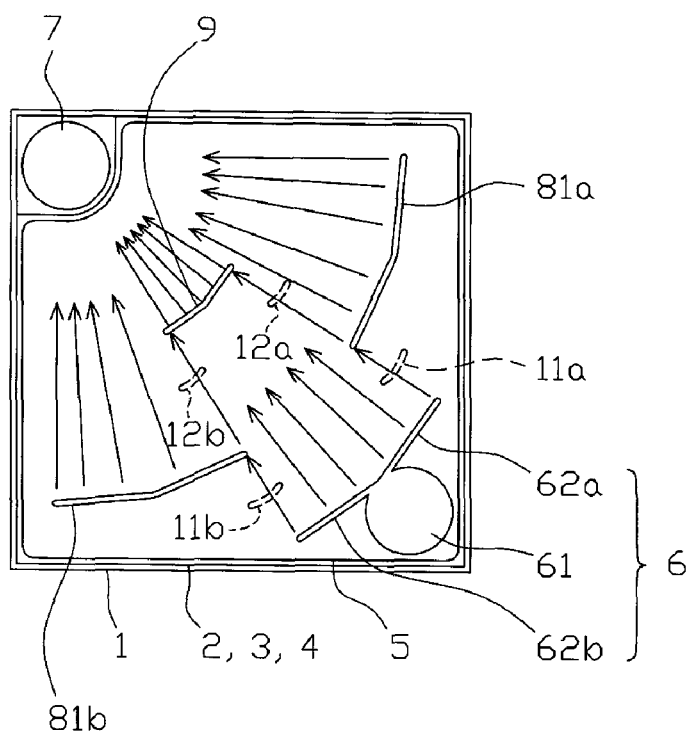
FIG. 27 is a top view showing still another exemplary embodiment of a face-up optical semiconductor device made in accordance with the principles of the presently disclosed subject matter.

In the above exemplary embodiment, the optical semiconductor device is configured to be rectangular when viewed from above. However, this is not limitative. As shown in FIG. 27, the optical semiconductor device can take a rectangular or square shape when viewed from above, and the p-side electrode 6 and the n-side electrode 7 can be disposed at diagonally opposed corners of the optical semiconductor device. In this case, the outside independent electrodes 81a and 82b can be provided on both sides while the center independent electrode 9 can be provided between them. The transparent insulation layers 11a and 11b can be disposed between the auxiliary electrode portions 62a and 62b and the outside independent electrodes 81a and 81b, respectively. Further, the transparent insulation layers 12a and 12b can be disposed between the outside independent electrodes 81a and 81b and the center independent electrode 9, respectively.

Figure 28A:
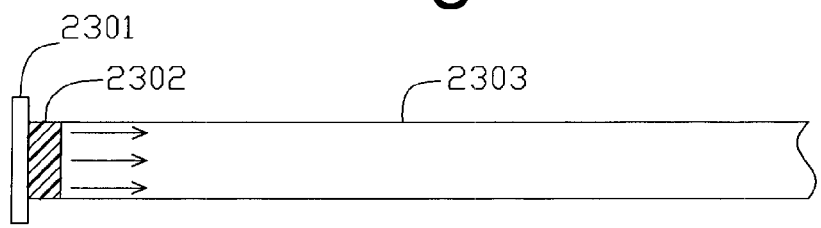
FIGS. 28A and 28B are a partial cross sectional view and a partial top view, respectively, illustrating a face-up optical semiconductor device assembly as a first example for use in a backlight light source.
Figure 28B:
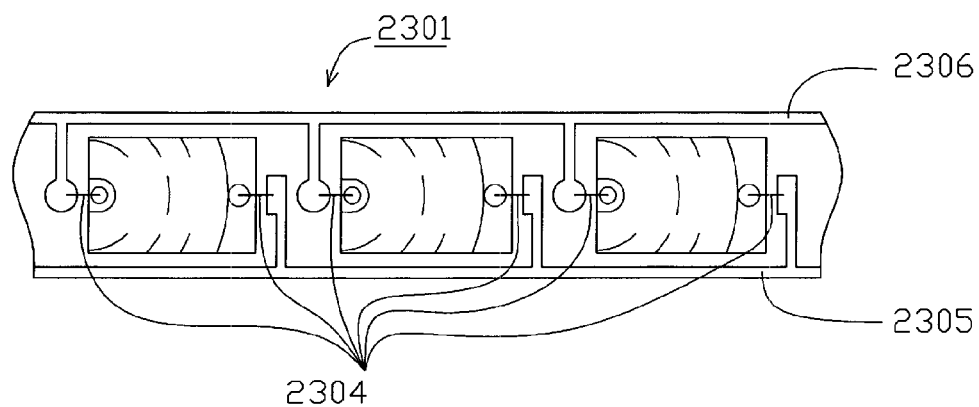

FIGS. 28A and 28B are a partial cross sectional view and a partial top view, respectively, illustrating a face-up optical semiconductor device assembly as a first example for use in a backlight light source. The face-up optical semiconductor device assembly 2301 can be composed of a plurality of the face-up optical semiconductor devices of any one of FIG. 6, FIG. 16, and FIG. 20, for example. If the face-up optical semiconductor device is a blue LED, a wavelength conversion material (such as a phosphor) 2302 can be coated thereon by, for example, screen printing to prepare a white LED. Then, the prepared white LEDs can be installed at the end portion of a light guide plate 2303. The assembly 2301 can have a positive electrode terminal 2305 and a negative electrode terminal 2306 along its longitudinal direction with branches disposed between the optical semiconductor devices. The pad portions of the electrodes of the face-up optical semiconductor devices can be electrically connected to the branches. In the illustrated exemplary embodiment, bonding wires 2304 arranged on a line can connect the optical semiconductor devices along its disposed direction of the optical semiconductor devices. (See FIG. 28B.) When the wavelength conversion material 2302 is printed by a squeezee, the squeezee may scratch the surfaces of the bonding wires 2304. However, this configuration can protect the bonding wires 2304 from being peeled off during the printing of the wavelength conversion material 2303 by the squeezee since the moving direction of the squeezee can be matched to the direction of the bonding wires 2304 and the possibility of catching wires by the squeezee can be decreased. Note that the bonding wires 2304 are arranged on a line at the center as shown in FIG. 28B, the wire bonding process can be carried out simply by linearly moving a stage on which the face-up optical semiconductor device assembly is mounted. Accordingly, since no waste movement is performed, the wire bonding process can be efficiently performed. Accordingly, the wire bonding machine can be limited to a simple stage movement mechanism for wire bonding with less expense.

Figure 29A:
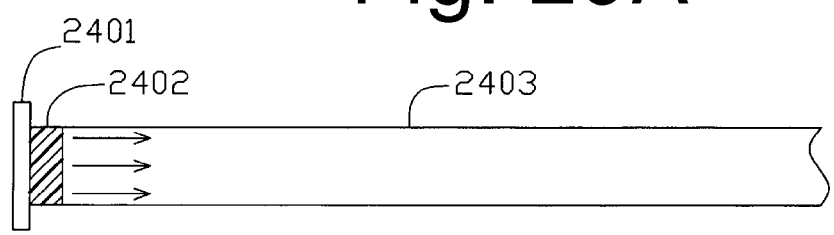
FIGS. 29A and 29B are a partial cross sectional view and a partial top view, respectively, illustrating a face-up optical semiconductor device assembly as a second example for use in a backlight light source.
Figure 29B:
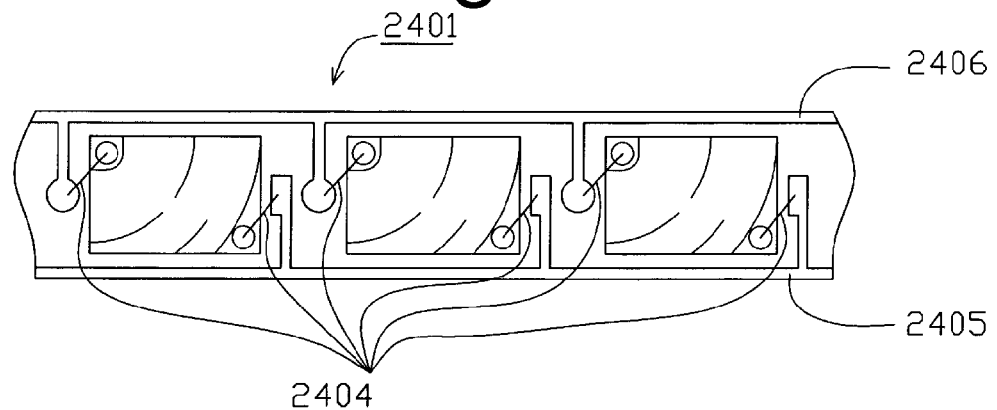

FIGS. 29A and 29B are a partial cross sectional view and a partial top view, respectively, illustrating a face-up optical semiconductor device assembly as a second example for use in a backlight light source. The face-up optical semiconductor device assembly 2401 can be composed of a plurality of the face-up optical semiconductor devices of FIG. 26, for example. If the face-up optical semiconductor device is a blue LED, a wavelength conversion material (such as a phosphor) 2402 can be coated thereon by, for example, screen printing to prepare a white LED. Then, the prepared white LEDs can be installed at the end portion of a light guide plate 2403. The assembly 2401 can have a positive electrode terminal 2405 and a negative electrode terminal 2406 along its longitudinal direction with branches disposed between the optical semiconductor devices. The pad portions of the electrodes of the face-up optical semiconductor devices can be electrically connected to the branches. In the illustrated exemplary embodiment, bonding wires 2304 arranged obliquely can connect the optical semiconductor devices along its disposed direction of the optical semiconductor devices. (See FIG. 29B.) When the wavelength conversion material 2402 is printed by a squeezee, the squeezee may scratch the surfaces of the bonding wires 2404. However, this configuration can protect the bonding wires 2404 from being peeled off during the printing of the wavelength conversion material 2403 by the squeezee if the moving direction of the squeezee is matched to the direction of the bonding wires 2404 (namely, the stage or squeezee is moved obliquely in accordance with the obliquely disposed bonding wires). This configuration can decrease the possibility of catching wires by the squeezee.

Figure 30A:
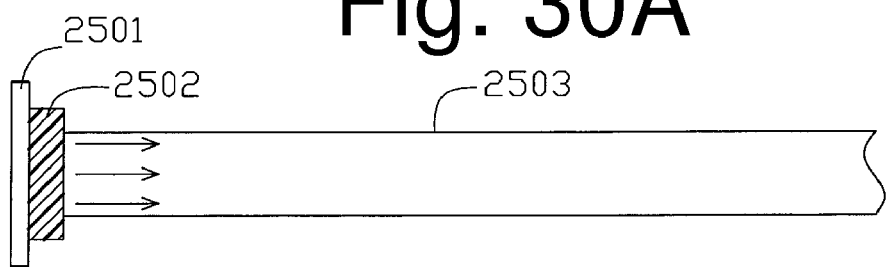
FIGS. 30A and 30B are a partial cross sectional view and a partial top view, respectively, illustrating a face-up optical semiconductor device assembly as a third example for use in a backlight light source.
Figure 30B:
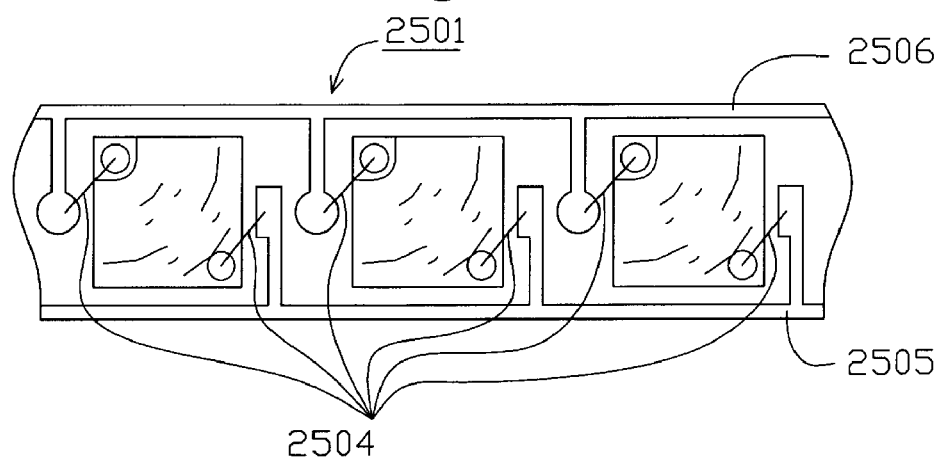

FIGS. 30A and 30B are a partial cross sectional view and a partial top view, respectively, illustrating a face-up optical semiconductor device assembly as a third example for use in a backlight light source. The face-up optical semiconductor device assembly 2501 can be composed of a plurality of the face-up optical semiconductor devices of FIG. 27, for example. If the face-up optical semiconductor device is a blue LED, a wavelength conversion material (such as a phosphor) 2502 can be coated thereon by, for example, screen printing to prepare a white LED. Then, the prepared white LEDs can be installed at the end portion of a light guide plate 2503. The assembly 2501 can have a positive electrode terminal 2505 and a negative electrode terminal 2506 along its longitudinal direction with branches disposed between the optical semiconductor devices. The pad portions of the electrodes of the face-up optical semiconductor devices can be electrically connected to the branches. In the illustrated exemplary embodiment, bonding wires 2504 arranged obliquely can connect the optical semiconductor devices along its disposed direction of the optical semiconductor devices. (See FIG. 30B.) When the wavelength conversion material 2502 is printed by a squeezee, the squeezee may scratch the surfaces of the bonding wires 2504. However, this configuration can protect the bonding wires 2504 from being peeled off during the printing of the wavelength conversion material 2503 by the squeezee if the moving direction of the squeezee is matched to the direction of the bonding wires 2504 (namely, the stage or squeezee is moved obliquely in accordance with the obliquely disposed bonding wires). This configuration can decrease the possibility of catching wires by the squeezee.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A face-up optical semiconductor device, comprising:
a first semiconductor layer of a first conductive type;
an active layer provided on the first semiconductor layer;
a second semiconductor layer of a second conductive type provided on the active layer;
a transparent electrode layer provided on the second semiconductor layer;
a first electrode having a pad portion provided on any of the second semiconductor layer and the transparent electrode layer and an auxiliary electrode portion connected to the pad portion;
a second electrode provided on an exposed region of the first semiconductor layer; and
at least one outside independent electrode disposed adjacent to the transparent electrode layer and between the auxiliary electrode portion and the second electrode, the outside independent electrode being physically independent of the auxiliary electrode portion, wherein
the auxiliary electrode portion is disposed on a first circle having a center located at the second electrode or on a tangent line of the first circle,
the outside independent electrode is disposed on a second circle having a center located at the second electrode or on a tangent line of the second circle so as to be an arc or linear electrode along the second circle or the tangent line of the second circle, and
a first radial distance between the first circle of the auxiliary electrode portion and the second circle of the outer independent electrode is smaller than a minimum value distance, the minimum value distance is measured between the pad electrode of the first electrode and an area, the area is a region of the transparent electrode layer where a current density of the transparent electrode layer is a minimum when the at least one outside independent electrode is removed.

2. The face-up optical semiconductor device according to claim 1, wherein the first radial distance is equal to or less than a current diffusion distance, the current diffusion distance being derived such that a difference between a minimum current density and a current density at the current diffusion distance becomes substantially 0.01 when a current density difference between a current density immediately below the pad portion and the minimum current density is substantially 1 when the at least one outside independent electrode is removed.

3. The face-up optical semiconductor device according to claim 2, wherein a sheet resistance of the transparent electrode layer is substantially 10 Ω/sq. to 25 Ω/sq., a contact resistivity between the second semiconductor layer and the transparent electrode layer is substantially $5 \times 10^{-4}$ Ωcm$^2$ to $7 \times 10^{-4}$ Ωcm$^2$, and the current diffusion distance is substantially 170 µm.

4. The face-up optical semiconductor device according to claim 2, wherein the first radial distance is substantially 15 to 90% of the current diffusion distance.

5. The face-up optical semiconductor device according to claim 3, wherein the first radial distance is substantially 15 to 90% of the current diffusion distance.

6. The face-up optical semiconductor device according to claim 1, wherein the outside independent electrode is disposed between the second semiconductor layer and the transparent electrode layer or on the semiconductor electrode layer.

7. The face-up optical semiconductor device according to claim 1, wherein an inside end portion of the outside independent electrode is disposed on an intersection between the second circle and a line connecting an outside end portion of the auxiliary electrode portion and a center of the second electrode, or on a position inward of the intersection.

8. The face-up optical semiconductor device according to claim 1, wherein an inside end portion of the outside independent electrode is disposed on a position outward of a region interposed between the pad portion of the first electrode and the second electrode.

9. The face-up optical semiconductor device according to claim 1, further comprising a center independent electrode disposed between the auxiliary electrode portion and the second electrode, and wherein
the center independent electrode is disposed on a third circle having a center located at the second electrode or on a tangent line of the third circle so as to extend along the third circle or the tangent line of the third circle.

10. The face-up optical semiconductor device according to claim 9, wherein the center independent electrode is disposed on any of the second semiconductor layer and the transparent electrode layer so as to be in contact with the transparent electrode layer.

11. The face-up optical semiconductor device according to claim 10, wherein a second radial distance between the first circle and the third circle is larger than the current diffusion distance,
a third radial distance between the second circle and the third circle is smaller than the minimum value distance, and
radii of the first circle, the second circle, and the third circle satisfy the relationship of the radius of the first circle is greater than the radius of the second circle which is greater than the radius of the third circle.

12. The face-up optical semiconductor device according to claim 10, wherein a second radial distance between the first circle and the third circle is larger than the minimum value distance,
a third radial distance between the second circle and the third circle is smaller than the current diffusion distance, and
radii of the first circle, the second circle, and the third circle satisfy the relationship of the radius of the first circle is greater than the radius of the second circle which is greater than the radius of the third circle.

13. The face-up optical semiconductor device according to claim 9, wherein an end portion of the center independent electrode is disposed on an intersection between the third circle and a line connecting an inside end portion of the outside independent electrode and the center of the second electrode or a position outward of the intersection.

14. The face-up optical semiconductor device according to claim 1, further comprising a transparent insulation layer disposed between the auxiliary electrode portion and the outside independent electrode adjacent to the auxiliary electrode portion or adjacent two outside independent electrodes, the transparent insulation layer being disposed on a fourth circle having a center located at the second electrode or on a tangent line of the fourth circle so as to extend along the fourth circle or the tangent line of the fourth circle, and wherein the transparent insulation layer is formed to include an intersection between the fourth circle and a line connecting the center of the second electrode and an outside end portion of the auxiliary electrode portion or an outside end portion of the outside independent electrode near the first electrode out of the two outside independent electrodes, a total distance from the intersection to the outside end portion of the transparent insulation layer and a fourth radial distance between the first circle and the second circle on which the outside independent electrode adjacent to the auxiliary electrode portion is formed with the second electrode as a center, or a fifth radial distance between the two second circles on which the two adjacent outside independent electrodes are formed with the second electrode as a center, is smaller than the minimum value distance.

15. The face-up optical semiconductor device according to claim 14, wherein a distance between the outside end portion of the transparent insulation layer and the intersection is smaller than a distance between the intersection and an inside end portion of the transparent insulation layer.

16. The face-up optical semiconductor device according to claim 14, wherein the center of the second electrode, the outside end portion of the transparent insulation layer, and an inside end portion of the outside independent electrode adjacent to the auxiliary electrode portion or an inside end portion of the outside independent electrode near the second electrode out of the two adjacent outside independent electrodes are arranged on a single line.

17. The face-up optical semiconductor device according to claim 11, further comprising a transparent insulation layer disposed between the outside independent electrode and the center independent electrode, the transparent insulation layer being disposed on a fifth circle having a center located at the second electrode or on a tangent line of the fifth circle so as to extend along the fifth circle or the tangent line of the fifth circle, and wherein the transparent insulation layer is formed to include an intersection between the fifth circle and a line connecting the center of the second electrode and an outside end portion of the auxiliary electrode portion near the first electrode, a total distance from the intersection to an inside end portion of the transparent insulation layer and a sixth radial distance between the first circle and the second circle on which the outside independent electrode adjacent to the auxiliary electrode portion is formed with the second electrode as a center, or a seventh radial distance between the second circle and the fifth circle on which the center independent electrode is formed, is smaller than the minimum value distance.

18. The face-up optical semiconductor device according to claim 17, wherein a distance between the inside end portion of the transparent insulation layer and the intersection is smaller than a distance between the intersection and an outside end portion of the transparent insulation layer.

19. The face-up optical semiconductor device according to claim 17, wherein the center of the second electrode, the outside end portion of the transparent insulation layer, and an outside end portion of the center independent electrode are arranged on a single line.

20. The face-up optical semiconductor device according to claim 1, having a rectangular shape as a plan view, and wherein the first electrode and the second electrode are located at a short side center of the face-up optical semiconductor device.

21. The face-up optical semiconductor device according to claim 1, having a rectangular shape as a plan view, and wherein the first electrode and the second electrode are located on respective opposed diagonal corners of the face-up optical semiconductor device.

22. The face-up optical semiconductor device according to claim 1, having a square shape as a plan view, and wherein the first electrode and the second electrode are located on respective opposed diagonal corners of the face-up optical semiconductor device.

* * * * *